United States Patent
Kushima et al.

(10) Patent No.: US 7,277,684 B2
(45) Date of Patent: Oct. 2, 2007

(54) ANTENNA AMPLIFIER AND SHARED ANTENNA AMPLIFIER

(75) Inventors: Naoki Kushima, Kobe (JP); Kazuo Takayama, Kobe (JP); Tetsuharu Imoto, Kobe (JP); Kazushige Ogino, Kobe (JP); Hirokazu Matsunaga, Kobe (JP); Nobuyoshi Tateishi, Kobe (JP)

(73) Assignee: Fujitsu Ten Limited, Hyogo (JP)

( * ) Notice: Subject to any disclaimer, the term of this patent is extended or adjusted under 35 U.S.C. 154(b) by 328 days.

(21) Appl. No.: 10/422,817

(22) Filed: Apr. 25, 2003

(65) Prior Publication Data

US 2004/0214545 A1 Oct. 28, 2004

(51) Int. Cl.
*H04B 7/00* (2006.01)

(52) U.S. Cl. .................... 455/232.1; 455/136

(58) Field of Classification Search ........... 455/130, 455/133, 136, 138, 140, 144, 269, 277.1, 455/553.1, 324; 333/214
See application file for complete search history.

(56) References Cited

U.S. PATENT DOCUMENTS

| | | | |
|---|---|---|---|
| 4,411,019 A * | 10/1983 | Rypkema | 455/180.2 |
| 5,230,096 A | 7/1993 | Davies et al. | |
| 5,930,692 A | 7/1999 | Peterzell et al. | |
| 6,028,496 A * | 2/2000 | Ko et al. | 333/214 |
| 6,052,566 A | 4/2000 | Abramsky et al. | |
| 6,172,559 B1 | 1/2001 | Yamaguchi | |
| 6,249,687 B1 * | 6/2001 | Thomsen et al. | 455/553.1 |
| 2003/0073423 A1 * | 4/2003 | Cho | 455/324 |
| 2003/0109239 A1 * | 6/2003 | Sabouri et al. | 455/307 |
| 2004/0077324 A1 * | 4/2004 | Wieck | 455/234.1 |
| 2004/0095190 A1 * | 5/2004 | Klaren et al. | 330/124 R |

FOREIGN PATENT DOCUMENTS

| | | |
|---|---|---|
| EP | 1026830 A1 | 8/2000 |
| JP | 2-28152 | 2/1990 |
| JP | 4-095417 | 3/1992 |
| JP | 5-102874 | 4/1993 |
| JP | 7-321685 | 12/1995 |
| JP | 10-028066 | 1/1998 |
| JP | 11-41127 | 2/1999 |
| JP | 11-145858 | 5/1999 |
| JP | 11-312938 | 11/1999 |
| JP | 2001-285097 | 10/2001 |

* cited by examiner

*Primary Examiner*—Duc M. Nguyen
*Assistant Examiner*—Justin Lee
(74) *Attorney, Agent, or Firm*—Wenderoth, Lind & Ponack, L.L.P.

(57) ABSTRACT

An object of the invention is to receive a weak signal with high sensitivity and reduce distortion and signal suppression when a strong interference signal exists. When a high-frequency signal received by an antenna is to be amplified by an antenna amplifier and when an interference wave of high field strength exists, a switch circuit is switched by an output switchover circuit from the output of an amplifier to a through-circuit. The through-circuit guides the high-frequency signal, directly to the output side without passing through the amplifier. When the switching operation of the switch circuit is performed based on low-frequency components which are highly correlated with distortion components due to intermodulation, the switching operation can be performed more adequately. Noises can be reduced by performing a smoothing process on the switching operation, and the use of an inverting amplifier can prevent occurrence of oscillation.

8 Claims, 20 Drawing Sheets

ANTENNA AMPLIFIER AND SHARED ANTENNA AMPLIFIER

BACKGROUND OF THE INVENTION

1. Field of the Invention

The invention relates to an antenna amplifier and a shared antenna amplifier which amplify a weak signal received by an antenna, at a position in the vicinity of the antenna.

2. Description of the Related Art

FIG. 20 schematically shows the electrical configuration of a conventional antenna amplifier 1. The antenna amplifier 1 is used for amplifying a weak high-frequency signal which is induced as a result of reception of a radio wave by an antenna, at a position in the vicinity of the antenna to enhance the signal-to-noise (SN) ratio. The weak high-frequency signal is amplified by a low noise amplifier 2. A band-pass filter (hereinafter, abbreviated to "BPF") 3 which limits the frequency band, and an attenuator (hereinafter, abbreviated to "ATT") circuit 4 are disposed on the side of the input of the amplifier 2. When the output of the amplifier 2 is increased, an automatic gain control (hereinafter, abbreviated to "AGC") circuit 5 lowers the signal attenuation factor of the ATT circuit 4 to lower the whole gain of the antenna amplifier 1. The antenna amplifier 1 has a further effect that a signal cable connecting the output of the amplifier 2 with a receiving apparatus such as a tuner is prevented from affecting the antenna.

Japanese Unexamined Patent Publication JP-A 5-102874 (1993) discloses a radio receiver antenna apparatus into which an RF preamplifier is incorporated. In the apparatus, bypass circuit means is disposed so that an RF signal is detected also in a path other than the RF preamplifier, and, when a strong signal is received by an antenna, the RF preamplifier is bypassed to prevent the amplifier from being overloaded. FIG. 2 of the publication shows a configuration in which a bypass circuit is normally connected to the preamplifier, and, when the RF preamplifier is to be bypassed, paths for input/output signals to the base and collector of a transistor that is used for amplification in the RF preamplifier are interrupted.

A technique relating to disposition of an amplifier circuit between an antenna and a tuner is disclosed also in, for example, Japanese Unexamined Patent Publication JP-A 11-41127 (1999). In the technique, a parallel circuit of a broadband amplifier and an attenuation circuit is connected between an antenna and a tuner, and a power supply to the broadband amplifier is controlled or switched so that, when the broadband amplifier is operated, a signal is amplified by the amplifier, and, when the broadband amplifier is not operated, a signal is attenuated by the attenuation circuit. Japanese Unexamined Patent Publication JP-A 7-321685 (1995) discloses a technique in which an amplifier and an attenuator are switched over by an amplifier circuit for an intermediate frequency that is converted from a high frequency by a front end for a tuner, so that the electric field strength can be correctly detected while avoiding a situation where the amplifier is saturated at high field strength.

Another reason of disposition of the AGC circuit 5 in FIG. 20 is to prevent the amplifier 2 from being distorted at high field strength. Japanese Unexamined Patent Publication JP-A 11-145858 (1999) discloses a technique relating to an AGC in which the gain is lowered only when sensitivity deterioration due to intermodulation interference occurs. Japanese Unexamined Patent Publication JP-A 11-312938 (1999) discloses a technique in which a time constant of an AGC is changed in accordance with the field strength in such a manner that the time constant is normally reduced so as to easily follow a fading phenomenon, and a time constant is increased in an environment of high field strength, thereby improving the stability.

In the antenna amplifier 1 shown in FIG. 20, in a case such as that where another signal of an excessive level exists at a frequency which is in the vicinity of the frequency of the target received signal, even when the ATT circuit 4 is switched so as to attenuate the signal, there is the possibility that the input level of the amplifier is excessively high and the target received signal is distorted or suppressed because of the nonlinearity of the amplifier 2. When the attenuation factor of the ATT circuit 4 is set to a large value, also the target signal is largely attenuated, and the SN ratio is lowered.

In the technique disclosed in JP-A 5-102874, when the RF preamplifier is bypassed, the operation of the RF preamplifier is completely stopped.

In the technique disclosed in JP-A 11-41127, the position where the amplifier circuit is to be disposed is not particularly clearly indicated. In the paragraph of "Embodiment of the Invention" of the publication, the whole set of the broadband amplifier, the attenuation circuit, and the tuner is defined as a tuner circuit. Therefore, it seems that the amplifier circuit is disposed not in the vicinity of the antenna, but on the side of the tuner. When it is assumed that the amplifier circuit is disposed as an antenna amplifier at a position which is separated from the tuner and in the vicinity of the antenna, a power supply cable which is ON/OFF controlled must be connected together with a signal cable between the antenna amplifier and the tuner. The power supply is controlled on the basis of the signal level of the stage subsequent to the tuner. The signal level is affected by the ON/OFF control of the broadband amplifier. Specifically, there is the possibility the following is repeatedly performed. When the signal level is judged to be excessive during the ON state of the broadband amplifier, the broadband amplifier is set to the OFF state, and the signal level is lowered. As a result, the signal level is judged not to be excessive, and the broadband amplifier is again set to the ON state.

In the case where an antenna amplifier is to perform an AGC operation, there arise problems of distortion and signal suppression due to intermodulation or cross modulation which occurs when an interference signal exists in the vicinity of a desired reception frequency. No countermeasure against such a case is described in JP-A 11-145858 and JP-A 11-312938. When an antenna element is to be used for a broad band, the signal range in which intermodulation or cross modulation may occur is widened. In a shared antenna amplifier which is used for sharing an antenna element in a broad frequency band, therefore, an adequate countermeasure must be taken.

SUMMARY OF THE INVENTION

An object of the invention is to provide an antenna amplifier and a shared antenna amplifier which can receive a weak signal with high sensitivity and can reduce distortion and signal suppression when a strong interference signal exists.

The invention provides an antenna amplifier which is to be disposed in a vicinity of an antenna, for amplifying a weak high-frequency signal received by the antenna, the antenna amplifier comprising:

an amplifier for amplifying a high-frequency signal;

a through-circuit for guiding a high-frequency signal to be inputted to the amplifier, without passing through the amplifier;

a switch circuit for switching over a high-frequency signal outputted from the amplifier and the high-frequency signal guided through the through-circuit; and an output switchover circuit, in response to an output of the amplifier and in accordance with a level relationship of the output with respect to a predetermined switchover criterion, for controlling the switch circuit to be switched to a side of the output of the amplifier when the output is lower, and to be switched to a side of the through-circuit when the output is higher, wherein a level detection for switching is performed on an output side, the amplifier has a negative feedback configuration, and, in a case of an input of a high level, an output of the amplifier is opened, whereby distortion of the amplifier itself is reduced and distortion which is generated in an input portion is eliminated.

According to the invention, the antenna amplifier which is to be disposed in the vicinity of the antenna, and which amplifies a weak high-frequency signal received by the antenna includes the amplifier, the through-circuit, the switch circuit, and the output switchover circuit. The switch circuit is switched over by the output switchover circuit, between the output of the amplifier which amplifies the high-frequency signal and the input of the amplifier which is guided through the through-circuit without being passed through the amplifier. In response to the output of the amplifier and in accordance with a level relationship of the output with respect to the predetermined switchover criterion, the output switchover circuit controls the switch circuit so that, when the output is lower, the switch circuit is switched to the output side of the amplifier, and, when the output is higher, the switch circuit is switched to the side of the through-circuit. When a weak high-frequency signal induced in the antenna is amplified by the amplifier, reception can be performed with high sensitivity. When there is an interference signal such as intermodulation, the high-frequency signal is guided to the subsequent stage through the through-circuit without being passed through the amplifier, and hence distortion, signal suppression and the like can be prevented from occurring. Since the signal from the amplifier is always supplied to the output switchover circuit for controlling the switch circuit, the switch circuit can adequately perform the switching operation. Since the level detection for switching is performed on the output side of the amplifier having a negative feedback configuration and, in a case of an input of a high level, the output of the amplifier is opened, distortion of the amplifier itself can be reduced and distortion which is generated in the input portion can be eliminated.

In the invention, it is preferable that the output switchover circuit has hysteresis, thereby preventing the switch circuit from performing frequent switching operations due to electric field variations.

According to the invention, since the output switchover circuit has hysteresis, the switch circuit can be prevented from performing frequent switching operations due to electric field variations, and a stable operation can be ensured.

In the invention, it is preferable that the output switchover circuit is subjected to a smoothing process, thereby preventing noises from being generated during switching operation, and the amplifier is configured as an inverting amplifier, thereby preventing oscillation from occurring at a timing when the switch circuit is connected to both the output side of the amplifier and the through-circuit during the switching operation.

According to the invention, since the output switchover circuit is subjected to the smoothing process, noises can be prevented from being generated during the operation of switching over between the output of the amplifier and the through-circuit. The amplifier is configured as an inverting amplifier. Even when a feedback loop from the output of the amplifier to the input is formed at a timing when both the sides are connected during the switching operation, therefore, a positive feedback is not formed, and hence oscillation can be prevented from occurring.

In the invention, it is preferable that when the antenna amplifier constitutes an AM antenna amplifier, an attenuator circuit is disposed in an input side in place of the through-circuit, and that the antenna amplifier includes a switch circuit and an input switchover circuit in place of the switch circuit and the output switchover circuit, and the switch circuit and the input switchover circuit cooperate to each other and, in a case of an input of a high level, perform a switching operation to cause the input to be attenuated by the attenuator circuit instead of the operation of switching to the through-circuit.

According to the invention, when the antenna amplifier constitutes an AM antenna amplifier in which the antenna impedance is high, in the case of a high-level input, attenuation of the input to the amplifier is performed instead of the operation of switching to the through-circuit, and the attenuated input is amplified by the amplifier. Even when a receiver or the like which receives a signal from the antenna amplifier has a low input impedance, therefore, the signal can be prevented from being excessively attenuated.

Furthermore, the invention provides a shared antenna amplifier comprising:

a plurality of antenna amplifiers mentioned above, wherein the plurality of antenna amplifiers amplify high-frequency signals of different frequency bands, respectively, and the switchover criteria of the plurality of antenna amplifiers are set to different values corresponding to frequency bands, respectively.

According to the invention, the plural antenna amplifiers in each of which, when the level of a high-frequency signal outputted from the amplifier is excessively high, a switching operation is performed so that the high-frequency signal is transmitted to the subsequent stage through the through-circuit without being passed through the amplifier are used for different frequency bands, respectively. The switchover criteria of the antenna amplifiers are set to different values in accordance with the frequency bands to be handled by the antenna amplifiers, respectively, thereby allowing the antenna amplifiers to adequately operate.

In the invention, it is preferable that the plurality of antenna amplifiers are an antenna amplifier for receiving FM radio broadcasting and television broadcasting of a VHF frequency band, and an antenna amplifier for receiving television broadcasting of a UHF frequency band, and the switchover criterion of the antenna amplifier for the VHF frequency band is set to be lower.

According to the invention, with respect to a switchover criterion for judging whether a signal is to be passed through the amplifier or not, the switchover criterion for FM radio broadcasting and television broadcasting of the VHF frequency band is made different from that for television broadcasting of the UHF frequency band. Therefore, the amplifiers can be adequately selectively used so that, in the VHF frequency band, the distortion characteristic in the case of a high-level input is emphasized, and, in the UHF frequency band, the sensitivity is emphasized.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
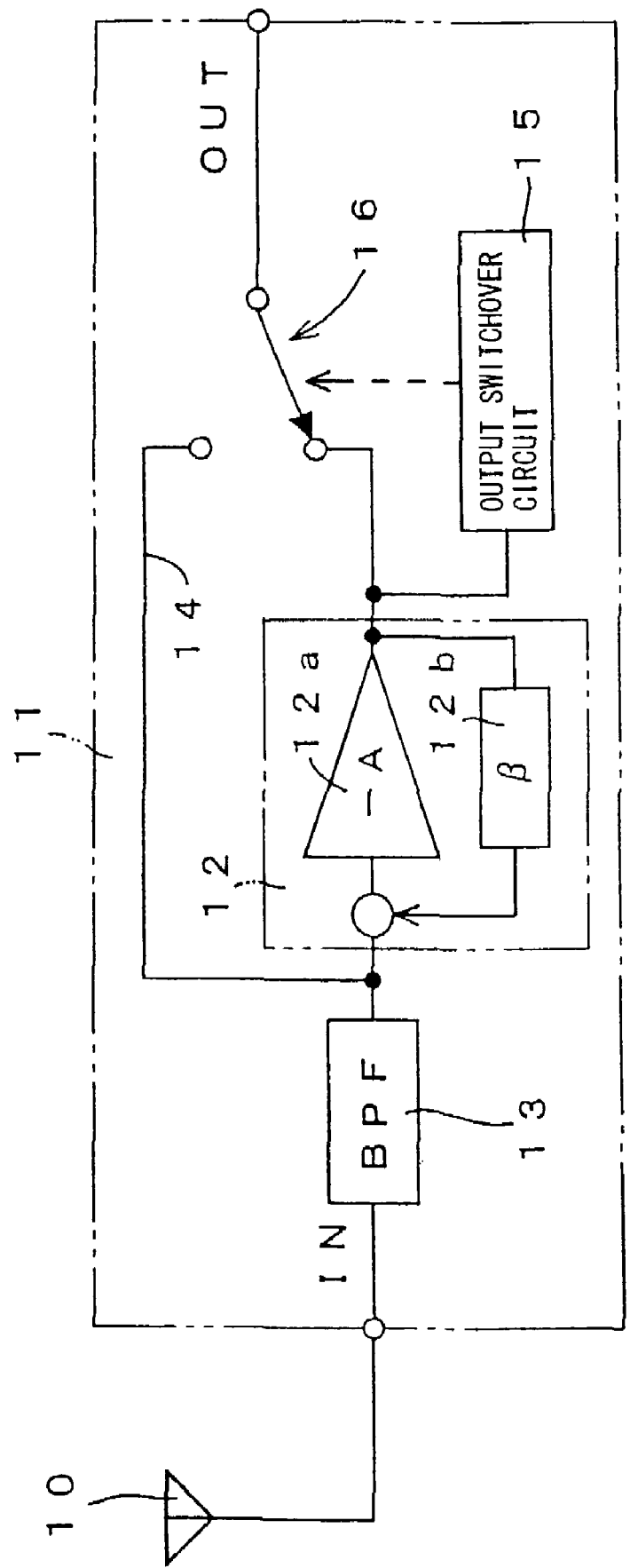
FIG. 1 is a block diagram schematically showing the electrical configuration of an antenna amplifier which is a first embodiment of the invention.

Now referring to the drawings, preferred embodiments of the invention are described below.

FIG. 1 schematically shows the electrical configuration of an antenna amplifier 11 which is a first embodiment of the invention, and which is disposed in the vicinity of an antenna 10 to amplify a weak high-frequency signal received by the antenna 10. The antenna amplifier 11 includes an amplifier 12, a band pass filter (abbreviated to "BPF") 13, a through-circuit 14, an output switchover circuit 15, and a switch circuit 16. The amplifier 12 includes: an inverting amplifier 12a in which the absolute value of the signal amplification factor is "A", and which is therefore indicated by "−A"; and a negative feedback circuit 12b which has a feedback factor β. The amplifier 12 amplifies the high-frequency signal. The BPF 13 selects a frequency band of the high-frequency signal which is inputted from the antenna 10 to the amplifier 12. The frequency band which is selected by the BPF 13 is so wide that not only the target received signal but also a signal which may cause interference are passed through the filter. In a stage subsequent to the antenna amplifier 11, for example, the high-frequency signal is converted to an intermediate-frequency signal, and only the target signal is selected by using a filter and the like. In the stage of the antenna amplifier 11, since the frequency is high, it is almost impossible to enhance the selectivity so as to select only the target signal. When the selectivity is enhanced, the center frequency must be changed in accordance with the reception frequency in order to cover a wide band.

Figure 2:
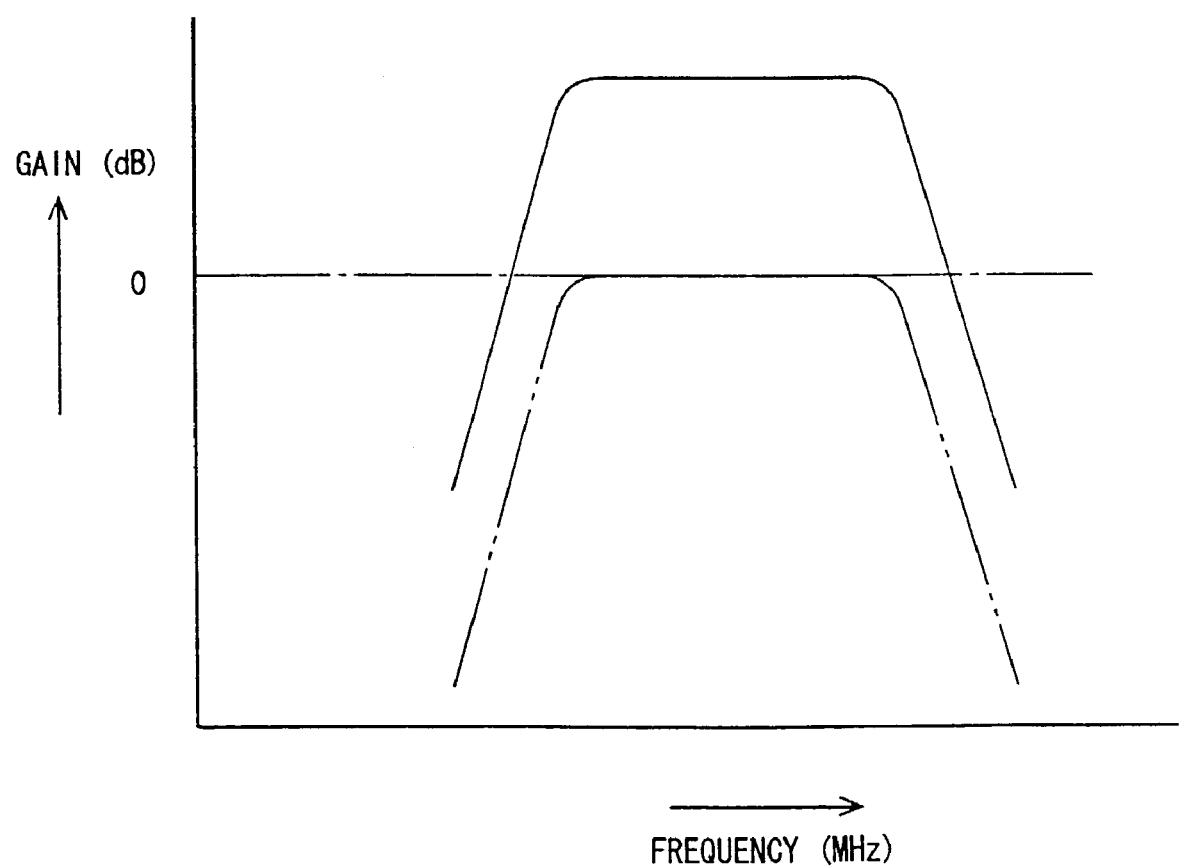
FIG. 2 is a graph showing changes of frequency characteristics of a gain which is caused by switching of a switch circuit in the embodiment of FIG. 1.

FIG. 2 shows frequency characteristics of the gain of the antenna amplifier 11 of FIG. 1. The solid line indicates a state where the switch circuit 16 is switched to the side of the output of the amplifier 12, and the two-dot chain line indicates a state where the switch circuit 16 is switched to the side of the through-circuit 14. The through-circuit 14 guides the high-frequency signal from the input of the amplifier 12 to the switch circuit 16 without passing through the amplifier 12. In response to an output of the amplifier 12 and in accordance with a level relationship of the output with respect to a predetermined switchover criterion, the output switchover circuit 15 controls the switch circuit 16 so as to, when the output is lower, be switched to the side of the output of the amplifier 12, and, when the output is higher, be switched to the side of the through-circuit 14. When the switch circuit 16 is switched to the side of the through-circuit 14, the gain of the antenna amplifier 11 is lowered by a degree corresponding to the gain of the amplifier 12. However, the high-frequency signal can be guided to the subsequent stage without being passed through the amplifier 12.

The gain of the amplifier 12 is set to, for example, 10 dB. The noise figure NF which is a ratio of the SN ratio in the input side of the amplifier 12 to that in the output side is 3 dB or less. A constant DC voltage is supplied as a power supply voltage to the amplifier 12, and the amplifier operates within the voltage range. Even in an ideal situation in which the power supply voltage can be completely used, the output is saturated with respect to an input voltage which exceeds a maximum input voltage that is obtained by setting the power supply voltage to the maximum amplitude and dividing the voltage by the gain. As compared with the ideal case, the actual amplifier 12 exhibits nonlinearity in which the gain is changed as the input voltage is higher, and distortion occurs also in the input side. In the case where the target received signal itself has a minute signal level and a neighboring received signal has a high signal level, although the signals can be separated from each other by a filter or the like in a subsequent stage, the target signal of the minute level is affected in the stage of the antenna amplifier 11 by intermodulation, cross modulation, or the like in which the signal is distorted or suppressed. In the embodiment, the case where FM broadcasting or TV broadcasting is received in the VHF frequency band will be considered. For example, the target reception frequency is set to about 100 MHz. When the reception level is not higher than 30 dBµV, the switch circuit 16 is switched to the side of the through-circuit 14, whereby signals in which the electric field strength is 110 dBµV and the frequency is lower by intervals of about 4 MHz can be prevented from causing intermodulation.

When the output of the amplifier 12 is high in level and there is an interference signal such as intermodulation, the output switchover circuit 15 of FIG. 1 guides the high-frequency signal through the through-circuit 14 to the subsequent stage without passing through the amplifier 12. Therefore, it is possible to avoid distortion, signal suppression, etc. Since the signal from the amplifier 12 is always supplied to the output switchover circuit 15 which controls the switch circuit 16, the switch circuit 16 can adequately perform the switching operation while reducing variation of conditions of the switching operation. The through-circuit 14 may be realized by a simple conductor wire, or by an attenuation circuit or the like.

Figure 3:
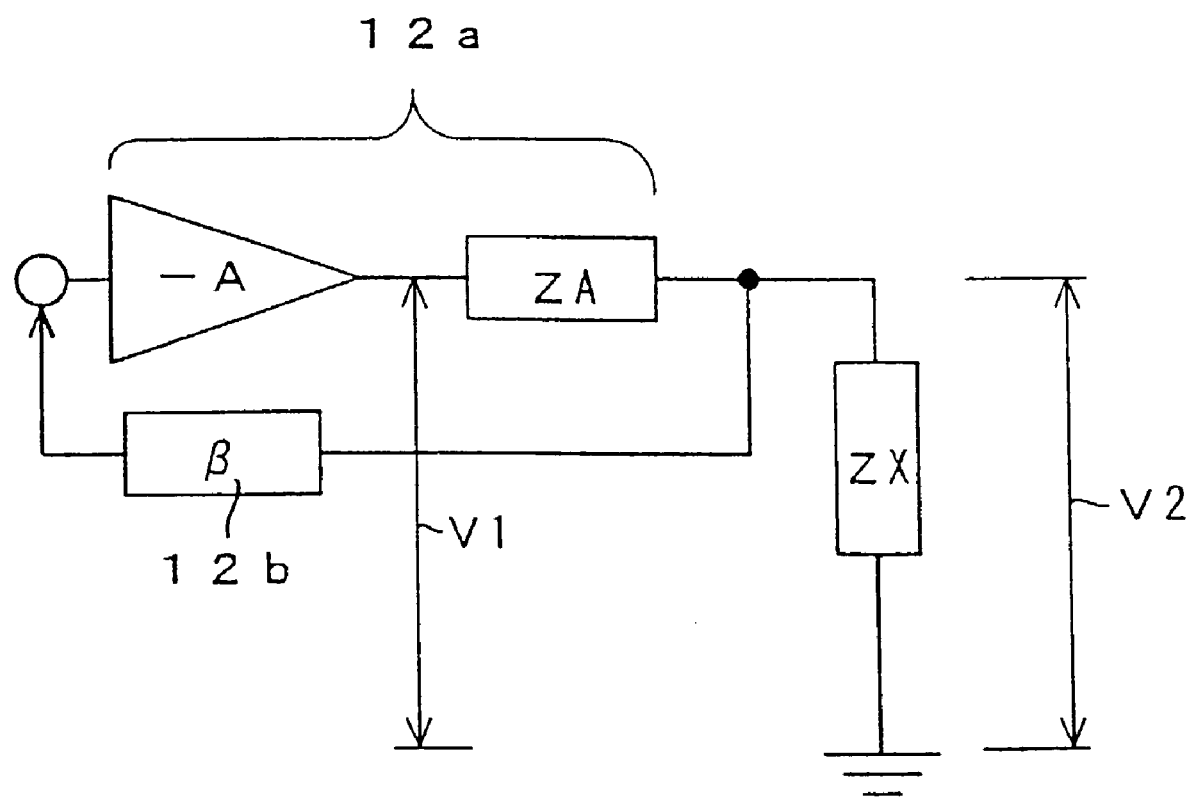
FIG. 3 is a diagram of an equivalent circuit in which an amplifier of FIG. 1 is configured by an inverting amplifier and a negative feedback circuit.

FIG. 3 shows an equivalent circuit in which the amplifier 12 is configured by combining an inverting amplifier 12a and a negative feedback circuit 12b. The output impedance of the inverting amplifier 12a is indicated by ZA, and the load of the antenna amplifier 11, i.e., the input impedance of a receiver set which receives the signal from the antenna amplifier 11, and the like is indicated by ZX. When the output voltage of the inverting amplifier 12a is indicated by V1 and that of the antenna amplifier 11 is indicated by V2, following expression (1) holds because of the negative feedback:

$$\frac{V1}{ZA+ZX} = \frac{V2}{VX} \quad (1)$$

When the expression is transformed, the following is obtained:

$$V2 = \frac{ZX}{ZA+ZX} \times V1 \quad (2)$$

When the load impedance ZX is equal to the output impedance ZA of the inverting amplifier 12a or ZX=ZA, the following is obtained from expression (2):

$$V2 = \frac{1}{2} \times V1 \quad (3)$$

When the load impedance ZX is very large and can be considered as infinite or ZX=∞, ZA of expression (2) is negligible, and the following is obtained:

$$V2=V1 \quad (4)$$

In the antenna amplifier 11, therefore, the feedback amount is changed in accordance with the output load, and, when the output load is eliminated, the feedback amount is increased, and distortion of the inverting amplifier 12a can be reduced.

Figure 4:
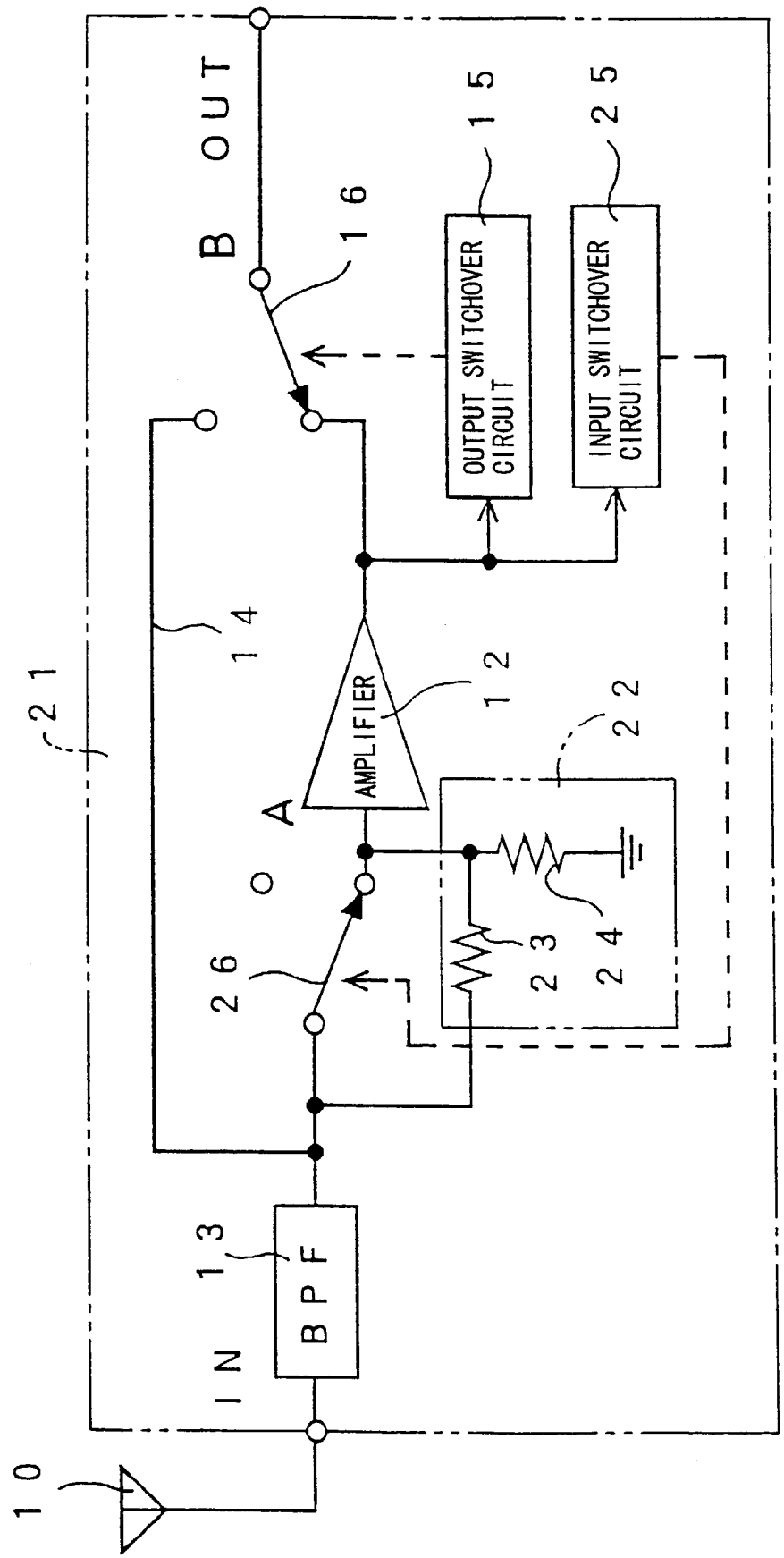
FIG. 4 is a block diagram schematically showing the electrical configuration of an antenna amplifier which is a second embodiment of the invention.

FIG. 4 schematically shows the electrical configuration of an antenna amplifier 21 which is a second embodiment of the invention. In the embodiment, components corresponding to those of the embodiment of FIG. 1 are denoted by the same reference numerals, and duplicate description is omitted. In the embodiment, an ATT circuit 22 is inserted into the input side of the amplifier 12 to attenuate a signal, so that the whole gain of the combination of the ATT circuit 22 and the amplifier 12 can be reduced. In the ATT circuit 22, a signal is attenuated on the basis of the division ratio of resistors 23 and 24. When the input signal level is low, an input switchover circuit 25 controls a switch circuit 26 so as to be switched to the input side of the amplifier 12, thereby producing a state where the resistor 23 is short-circuited. In this state, the input signal is inputted to the amplifier 12 without being attenuated. When the input switchover circuit 25 controls the switch circuit 26 so as to be disconnected from the input side of the amplifier 12, the input signal is attenuated by the ATT circuit 22, and then inputted to the amplifier 12. A threshold Vthy of the input switchover circuit 25 for switching the switch circuit 26 is set to be higher than a threshold Vthx of the output switchover circuit 15 for switching the switch circuit 16. Namely, Vthy>Vthx. Each of the thresholds Vthx and Vthy has hysteresis.

Figure 5A:
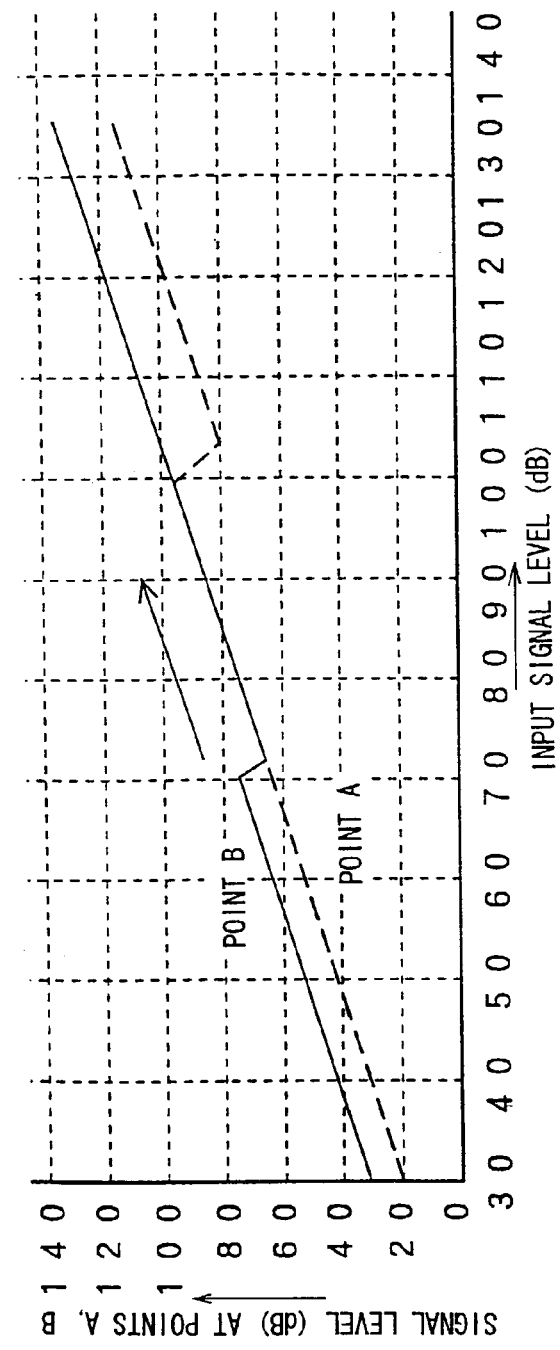
FIGS. 5A and 5B are graphs showing hysteresis characteristics of the operation of the antenna amplifier of FIG. 4.
Figure 5B:
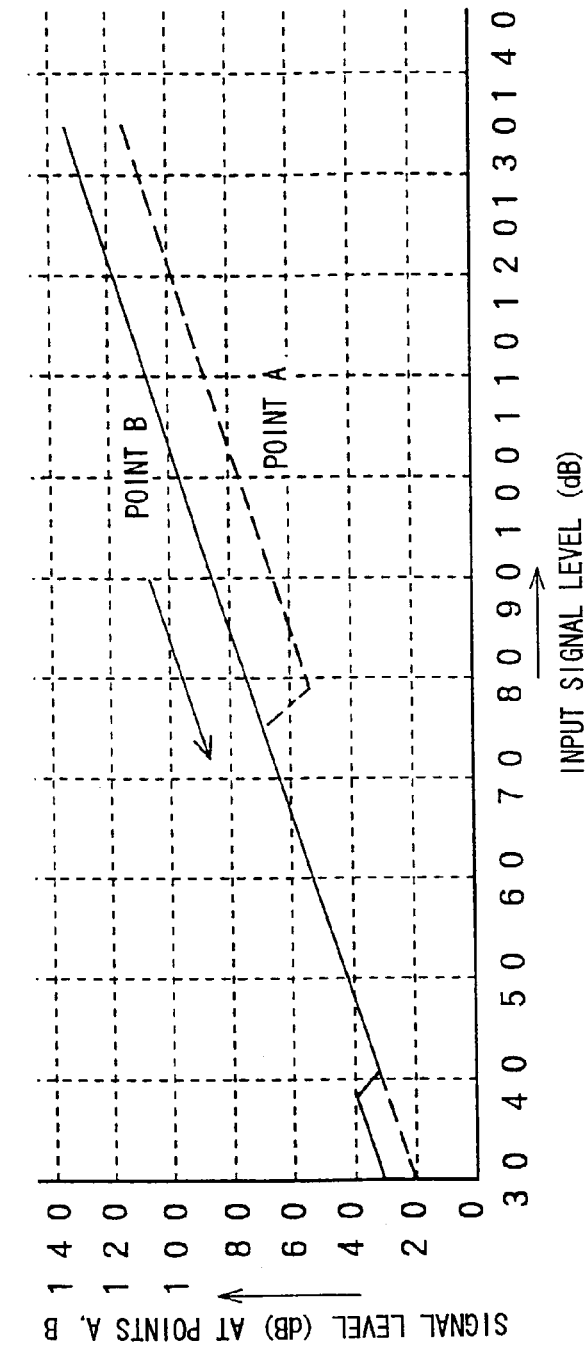

FIG. 5A shows input/output characteristics of the embodiment of FIG. 4 in the case where the level of the signal input from the antenna 10 is being raised, and FIG. 5B shows those in the case where the input signal level is being lowered. The point A is on the side of the input of the amplifier 12 of FIG. 4 and the amplifier-side individual contact of the switch circuit 26, and the point B is on the side of the output of the amplifier 12 and the common contact of the switch circuit 16. The gain of the amplifier 12 is 10 dB, and the attenuation factor of the ATT circuit 22 is −20 dB. The signal level at the point A is indicated by the broken line, and that at the point B is indicated by the solid line.

As shown in FIG. 5A, when the input signal level is raised from a low-input level state to exceed 70 dB, the output switchover circuit 15 controls the switch circuit 16 so as to be switched from the output side of the amplifier 12 to the side of the through-circuit 14, and the signal level at the point B is lowered by 10 dB. When the input signal level is further raised to exceed 100 dB, the input switchover circuit 25 controls the switch circuit 26 so as to be switched from the state where the switch circuit is connected to the input side of the amplifier 12, to a non-connection state. The signal level at the point B is lowered by 20 dB as a result of the attenuation by the ATT circuit 22.

As shown in FIG. 5B, when the input signal level is lowered from a high-input level state to be 80 dB or lower, the input switchover circuit 25 controls the switch circuit 26 so as to be switched-from the non-connection state to the input side of the amplifier 12, and therefore the signal level at the point A is raised by a degree corresponding to the attenuation factor of 20 dB of the ATT circuit 22. When the input signal level is further lowered to be 40 dB or lower, the output switchover circuit 15 controls the switch circuit 16 so as to be switched from the side of the through-circuit 14 to the output side of the amplifier 12, and therefore the signal level at the point B is raised by a degree corresponding to the gain of 10 dB of the amplifier 12.

In the operations shown in FIGS. 5A and 5B, the detection starting point where the output switchover circuit 15 controls the switch circuit 16 so as to be switched is at 70 dB of the input signal level. When the switch circuit is once switched to the side of the through-circuit 14, hysteresis of 30 dB is produced, so that, only after the level is lowered to 40 dB, the switch circuit is switched to the output side of the amplifier 12. The detection starting point where the input switchover circuit 25 controls the switch circuit 26 so as to be switched is at 100 dB of the input signal level. When the switch circuit is once switched to the non-connection side, hysteresis of 20 dB is produced, so that, only after the level is lowered to 80 dB, the switch circuit is switched to the input side of the amplifier 12. In accordance with a control signal from the outside, the gain can be switched in at least two steps.

Figure 6:
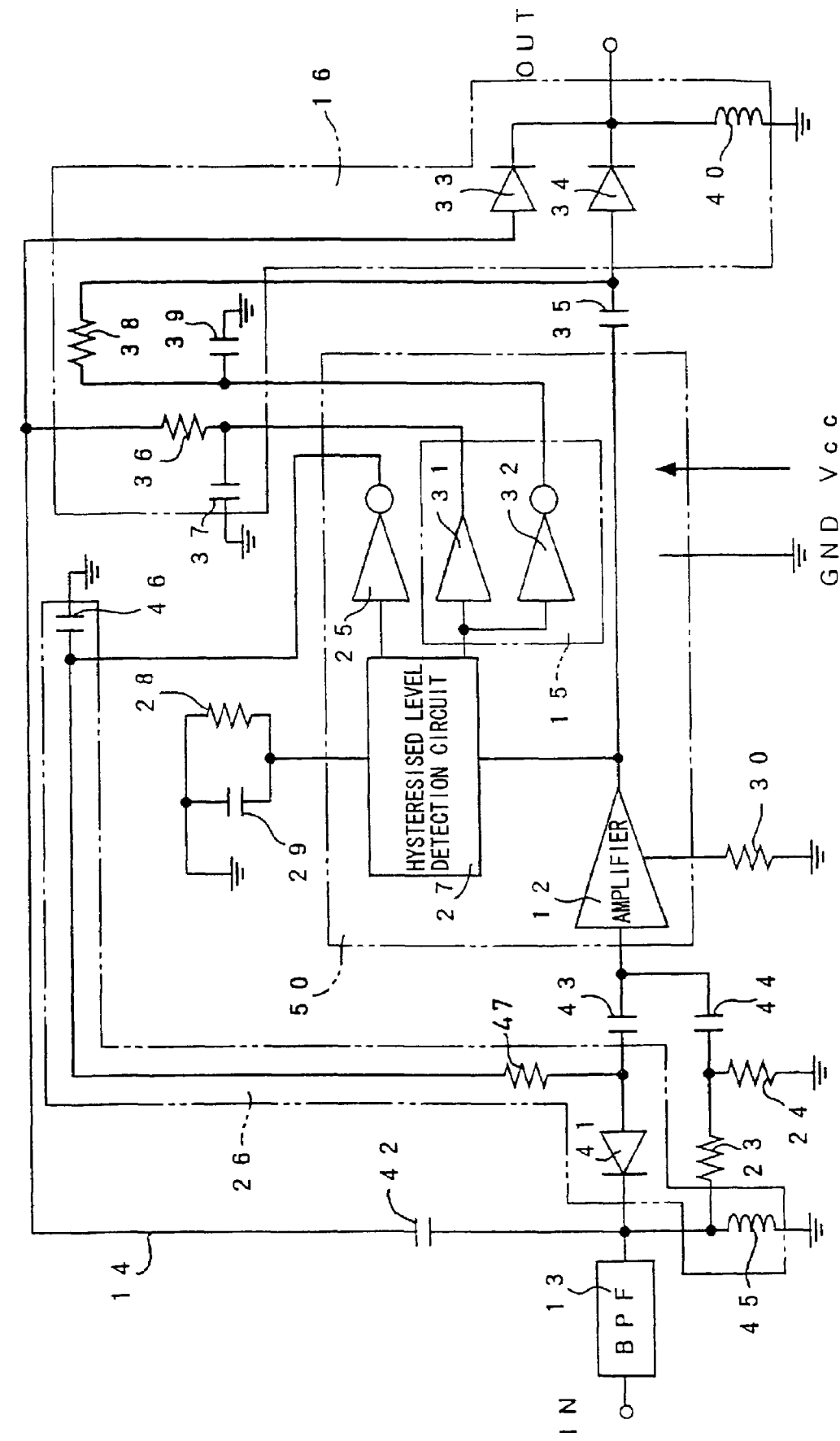
FIG. 6 is an electrical circuit diagram of the antenna amplifier of FIG. 4.

FIG. 6 shows the circuit configuration of the antenna amplifier 21 of FIG. 4. The output of a hysteresised level detection circuit 27 which has the hysteresis characteristics shown in FIGS. 5A and 5B is given to the output switchover circuit 15 and the input switchover circuit 25. The hysteresised level detection circuit 27 detects the output level of the amplifier 12. The operation characteristics of the hysteresised level detection circuit 27 can be adjusted by an external resistor 28 and a capacitor 29. The resistor 28 determines the thresholds Vthx and Vthy. The capacitor 29 determines a time constant of the level detection. The transient characteristics of the level detection are set so that the attack time is short and the release time is long. The gain of the amplifier 12 can be adjusted in a range of, for example, 3 to 15 dB by an external resistor 30. The output switchover circuit 15 has PIN drivers 31 and 32. The PIN driver 31 is a buffer in which the output logic is a positive logic, and the PIN driver 32 is an inverter in which the output logic is a negative logic. The input switchover circuit 25 also includes a PIN driver serving as an inverter.

The switch circuit 16 includes PIN diodes 33 and 34 serving as switching elements. The cathodes of the PIN diodes 33 and 34 are commonly connected to an output terminal OUT. The through-circuit 14 is connected to the anode of the PIN diode 33. The output of the amplifier 12 is connected via a DC-blocking capacitor 35 to the anode of the PIN diode 34. The output of the PIN driver 31 is connected via a resistor 36 to the anode of the PIN diode 33. A capacitor 37 for preventing switching shock is connected between the output of the PIN driver 31 and the ground. The output of the PIN driver 32 is supplied via a resistor 38 to the anode of the PIN diode 34. A capacitor 39 for preventing switching shock is connected between the output of the PIN driver 32 and the ground. A coil 40 which will serve as a path for a DC current is connected between the cathodes of the PIN diodes 33 and 34 and the ground.

The switch circuit 26 includes a PIN diode 41 serving as a switching element. The cathode of the PIN diode 41 is connected to a point where the output of the BPF 13 branches off to the through-circuit 14 via a DC-blocking capacitor 42. The anode of the PIN diode 41 is connected to the input of the amplifier 12 via a DC-blocking capacitor 43. The input of the amplifier 12 is connected also to the junction of the resistors 23 and 24 via a DC-blocking capacitor 44. A coil 45 which will serve as a path for a DC current is connected between the cathode of the PIN diode 41 and the ground. A capacitor 46 for preventing switching shock is connected between the output of the input switchover circuit 25 and the ground. The output of the input switchover circuit 25 is connected to the anode of the PIN diode 41 via a resistor 47. When a DC current is supplied to the PIN diodes 33, 34, and 41, the impedances of the diodes are lowered to close the corresponding switch circuits. When a DC current is not supplied to the PIN diodes 33, 34, and 41, the impedances of the diodes are raised to open the corresponding switch circuits. In the embodiment, the amplifier 12, the output switchover circuit 15, the input switchover circuit 25, and the hysteresised level detection circuit 27 are integrated into an IC 50.

Figure 7:
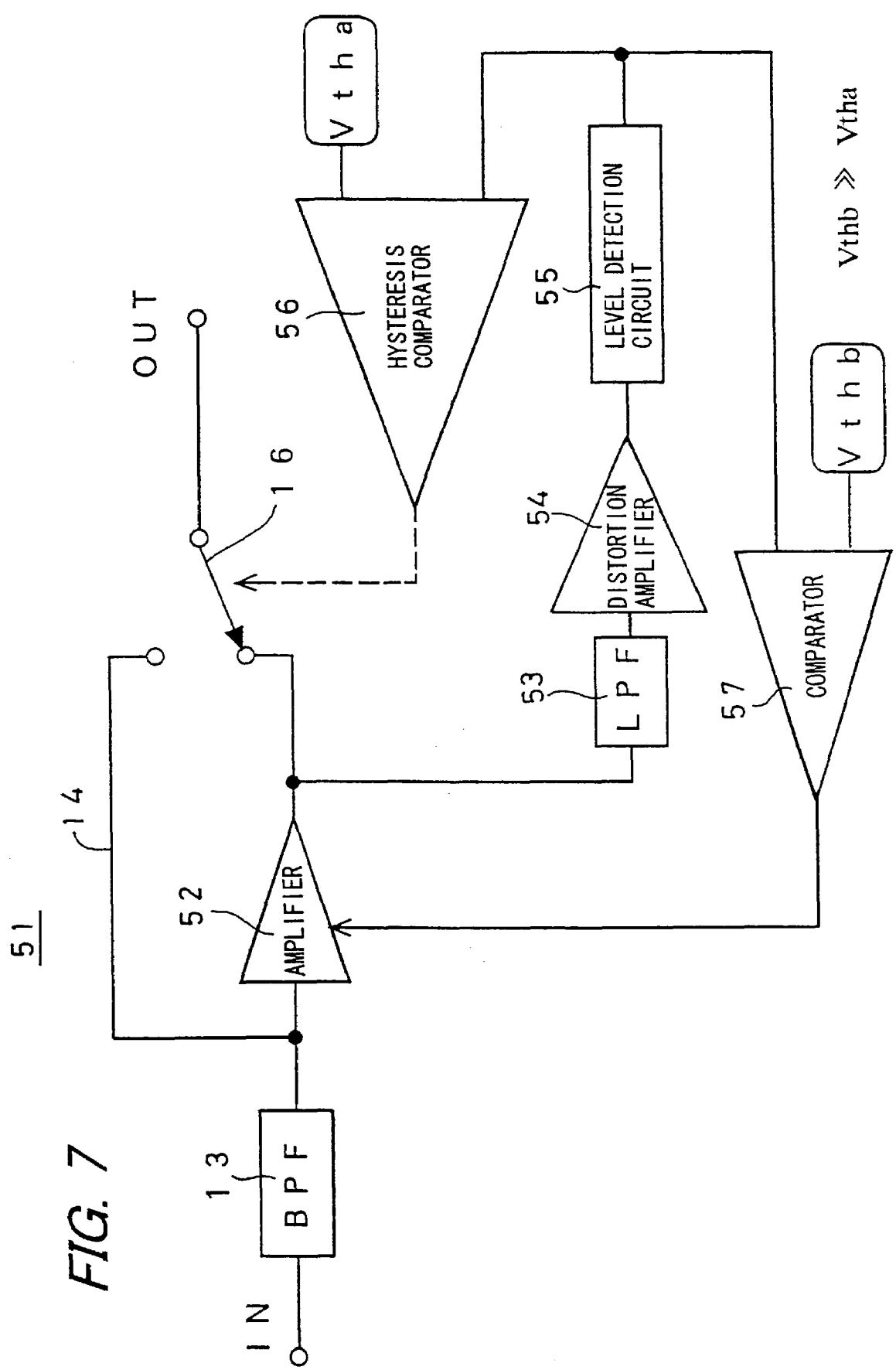
FIG. 7 is a block diagram schematically showing the electrical configuration of an antenna amplifier which is a third embodiment of the invention.

FIG. 7 schematically shows the electrical configuration of an antenna amplifier 51 which is a third embodiment of the invention. In the embodiment, components corresponding to those of the embodiments of FIG. 1 or 4 are denoted by the same reference numerals, and duplicate description is omitted. In the embodiment, the gain of an amplifier 52 can be switched in at least two steps in accordance with a control signal from the outside. The switching of the gain may be performed by changing the gain of the amplifier 52 itself stepwise or continuously, or by maintaining the gain of the amplifier 52 constant and changing the signal attenuation factor by an ATT circuit or the like on the input side in the same manner as the embodiment of FIG. 4.

As described above, the output of the amplifier 52 contains distortion components due to intermodulation or cross modulation. Such distortion components are reflected to low-frequency components of the output of the amplifier 52. The low-frequency components are low-pass filtered by a low-pass filter (hereinafter, abbreviated to "LPF") 53 and then amplified by a distortion amplifier 54. The output level of the distortion amplifier 54 is detected in the form of an absolute value by a level detection circuit 55, and compared with preset thresholds Vtha and Vthb in a hysteresis comparator 56 and a comparator 57. The thresholds are set so as to have a relationship of Vthb>>Vtha.

When the signal level of the distortion components detected by the level detection circuit 55 exceeds the threshold Vtha, the hysteresis comparator 56 controls the switch circuit 16 so as to be switched to the side of the through-circuit 14. With respect to this function, the LPF 53, the distortion amplifier 54, the level detection circuit 55, and the hysteresis comparator 56 are identical with the output switchover circuit 15 of FIG. 1. The LPF 53 selects low-frequency distortion components. When there is an interference signal which may cause intermodulation or cross modulation, the switch circuit can be switched so that the high-frequency signal is passed through the through-circuit 14 without being passed through the amplifier 52. Therefore, the switching operation can be adequately performed so that, when there is no interference signal, the high-frequency signal is passed through the amplifier 52, and, only when there is an interference signal, the high-frequency signal is not passed through the amplifier 52.

After the switch circuit 16 is switched to the side of the through-circuit 14, the hysteresis comparator 56 does not control the switch circuit 16 to perform the switching operation even when the output voltage of the level detection circuit 55 is simply equal to or lower than Vtha. The threshold for causing the switch circuit 16 to perform the switching operation is lowered from Vtha by $\Delta V$. When the output voltage of the level detection circuit 55 is further lowered to the lowered threshold Vtha−$\Delta V$ or less, the switch circuit 16 is switched to the output side of the amplifier 52. When this switching is performed, the threshold is returned to Vtha. Since the threshold is provided with such hysteresis, the switch circuit 16 can be prevented from frequently performing the switching operation even when the output voltage of the level detection circuit 55 fluctuates in the vicinity of Vtha. The configuration relating to the switching of the switch circuit 16 in the embodiment can be similarly applied to the embodiments of FIGS. 1 and 4.

In the embodiment, when the output voltage of the level detection circuit 55 exceeds the threshold Vthb of the comparator 57, the gain of the amplifier 52 is lowered. Since the gain of the amplifier 52 is lowered in the case of such an excessive input, distortion which may be generated in the amplifier 52 can be suppressed. When large distortion is generated in the amplifier 52, distortion components leak from the input side to the through-circuit 14, and hence influences due to intermodulation or cross modulation are caused even in the case where the switch circuit 16 is switched to the side of the through-circuit 14. When a switch or the like is simply disposed on the input side of the amplifier 52 in order to eliminate such influences, the input to the amplifier 52 is interrupted and the signal for switching cannot be obtained. In the embodiment, when the output of the amplifier 52 is excessive, the output voltage exceeds the threshold Vthb of the comparator 57 which is higher than the switchover criterion or the threshold Vtha of the hysteresis comparator 56 that controls the switching operation of the switch circuit 16. When the output voltage exceeds the threshold Vthb which is the attenuation criterion, the gain of the amplifier 52 is reduced by the comparator 57 serving as a gain control circuit. Therefore, the switching operation of the switch circuit 16 can be prevented from being affected by saturation of the amplifier 52 and distortion on the input side.

Figure 8:
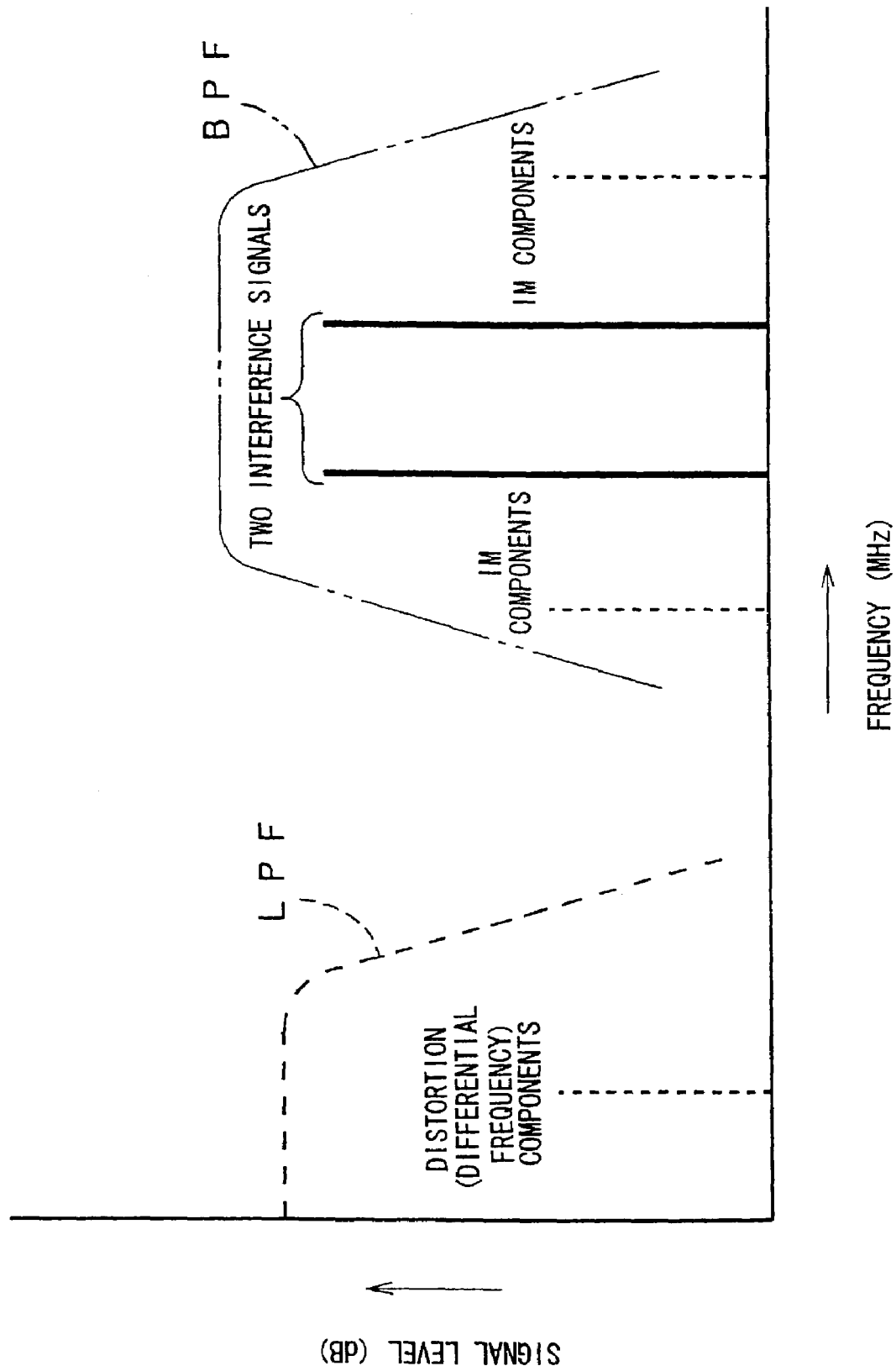
FIG. 8 is a graph showing the concept of reduction of input distortion in the embodiment of FIG. 7.

FIG. 8 shows the concept of reduction of input distortion in the embodiment of FIG. 7. Since the pass frequency band of the BPF 13 is wide, also an interference signal which is within the band, and which has a high electric field strength is allowed to pass the filter, or even a signal which is outside the band cannot be attenuated by a large degree. When there are two interference signals of a high electric field strength, the frequency components of the difference between the signals are produced as distortion components to cause intermodulation due to the nonlinearity of the amplifier 52. When an interference signal of a high electric field strength is a broadband signal of the spread spectrum (SS) modulation system, distortion components of a low frequency band is generated by even a single signal. Two interference signals or a single broadband signal generates also IM components as distortion due to intermodulation. Even in the case of IM components, there is the possibility that the signal level is considerably higher than the level of the target signal. There is the other possibility that IM components have a frequency close to the target reception frequency, and are passed through a filter in the subsequent stage to cause an AGC circuit or the like to operate, thereby suppressing the target received signal. In the embodiment, distortion components in a range which is lower than the lower cut-off frequency of the BPF 13 are extracted by the LPF 53, generation of intermodulation is detected in a highly correlated state, and the switching operation is adequately performed, whereby input distortion can be reduced.

Figure 9:
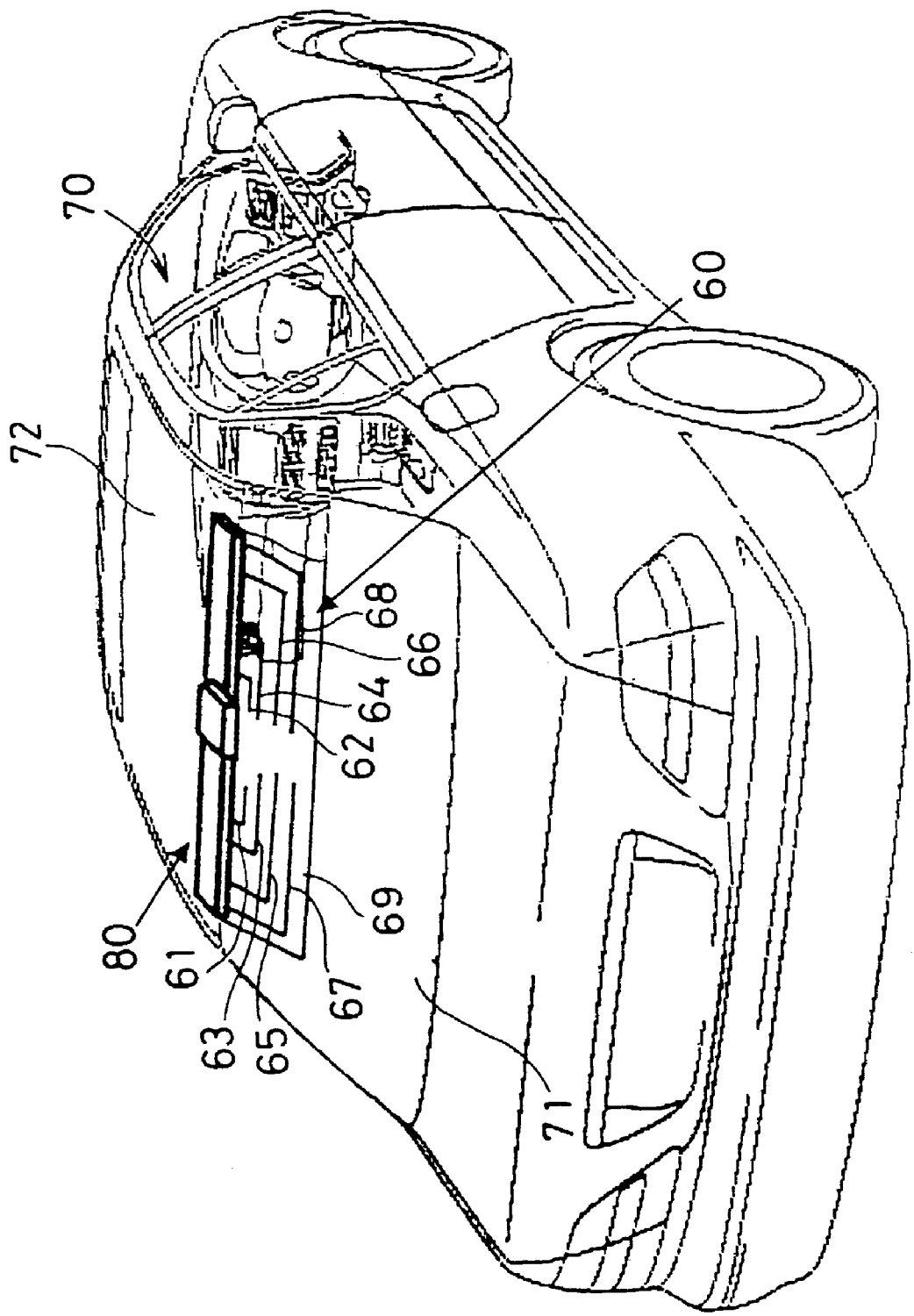
FIG. 9 is a perspective view schematically showing a state where an amplifier module including a plurality of antenna amplifiers is mounted on an automobile as a fourth embodiment of the invention.

FIG. 9 shows a fourth embodiment of the invention in which a plurality of antenna amplifiers such as shown in FIG. 1, 4, or 7 are mounted on an automobile. A glass antenna 60 having a plurality of antenna elements 61, 62, 63, 64, 65, 66, 67, and 68 which are formed as conductor patterns on a film base 69 is bonded to the inner side of a rear window glass 71 of a vehicle 70. The position where the glass antenna 60 is bonded is in an upper edge portion of the rear window glass 71 which is close to a roof 72. An amplifier module 80 in which the antenna amplifiers are mounted is placed on the side of the roof 72.

Figure 10:
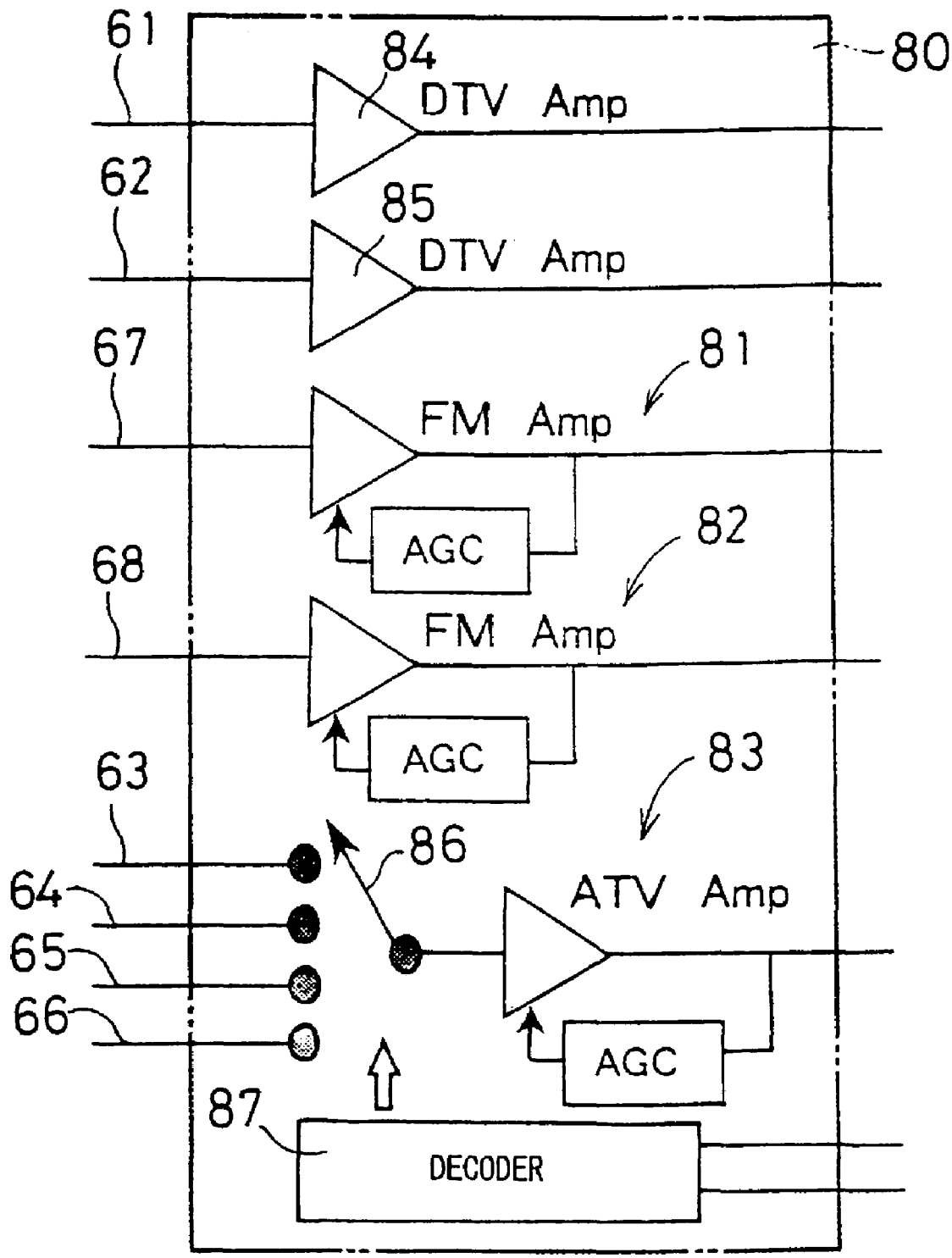
FIG. 10 is a block diagram schematically showing the electrical configuration of the amplifier module of FIG. 9.

FIG. 10 schematically shows the electrical configuration of the amplifier module 80 of FIG. 9. In the amplifier module 80, AGC amplifiers 81, 82, and 83 which are equivalent to the antenna amplifier 11, 21, or 51 of FIG. 1, 4, or 7, and broadband and low-noise amplifiers 84 and 85 are mounted as antenna amplifiers which amplify signals received by the antenna elements 61 to 68. The signals received by the antenna elements 61 and 62 are amplified by the amplifiers 84 and 85, respectively, and then output as digital television (DTV) signals to the subsequent stage. The signals received by the antenna elements 63, 64, 65, and 66 are selected by a selector 86, amplified by the AGC amplifier 83, and then output as analog television (ATV) signals to the subsequent stage. The selector 86 is switched over on the basis of a control signal which is supplied to a decoder 87 from the subsequent stage, in order to attain improvement of the reception sensitivity by the diversity system. The signals received by the antenna elements 67 and 68 are amplified by the AGC amplifiers 81 and 82, respectively, and then output as the main and sub signals of FM broadcasting to the subsequent stage. In the subsequent stage, the main and sub signals are switched over, so that improvement of the sound quality by the diversity system can be performed.

Figure 11:
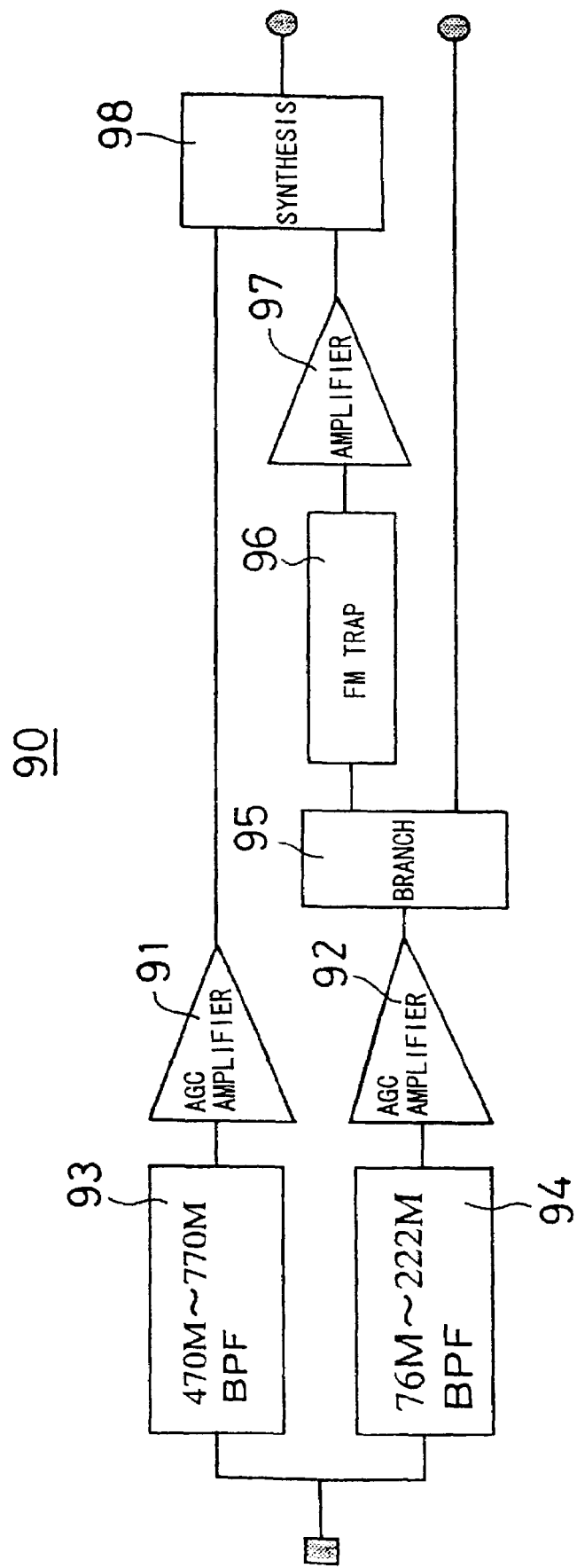
FIG. 11 is a block diagram schematically showing the electrical configuration of a shared antenna amplifier which is a fifth embodiment of the invention.

FIG. 11 schematically shows the electrical configuration of a shared antenna amplifier 90 which is a fifth embodiment of the invention. The shared antenna amplifier 90 of the embodiment includes a plurality of antenna amplifiers 11, 21, or 51 of FIG. 1, 4, or 7 as AGC amplifiers 91 and 92. A high-frequency signal is inputted to the AGC amplifier 91 from a BPF 93 which selectively allows a frequency band of, for example, 470 MHz in the UHF band to pass therethrough. A high-frequency signal is inputted to the AGC amplifier 92 from a BPF 94 which selectively allows a frequency band of, for example, 76 to 222 MHz in the VHF band to pass therethrough.

Figure 12:
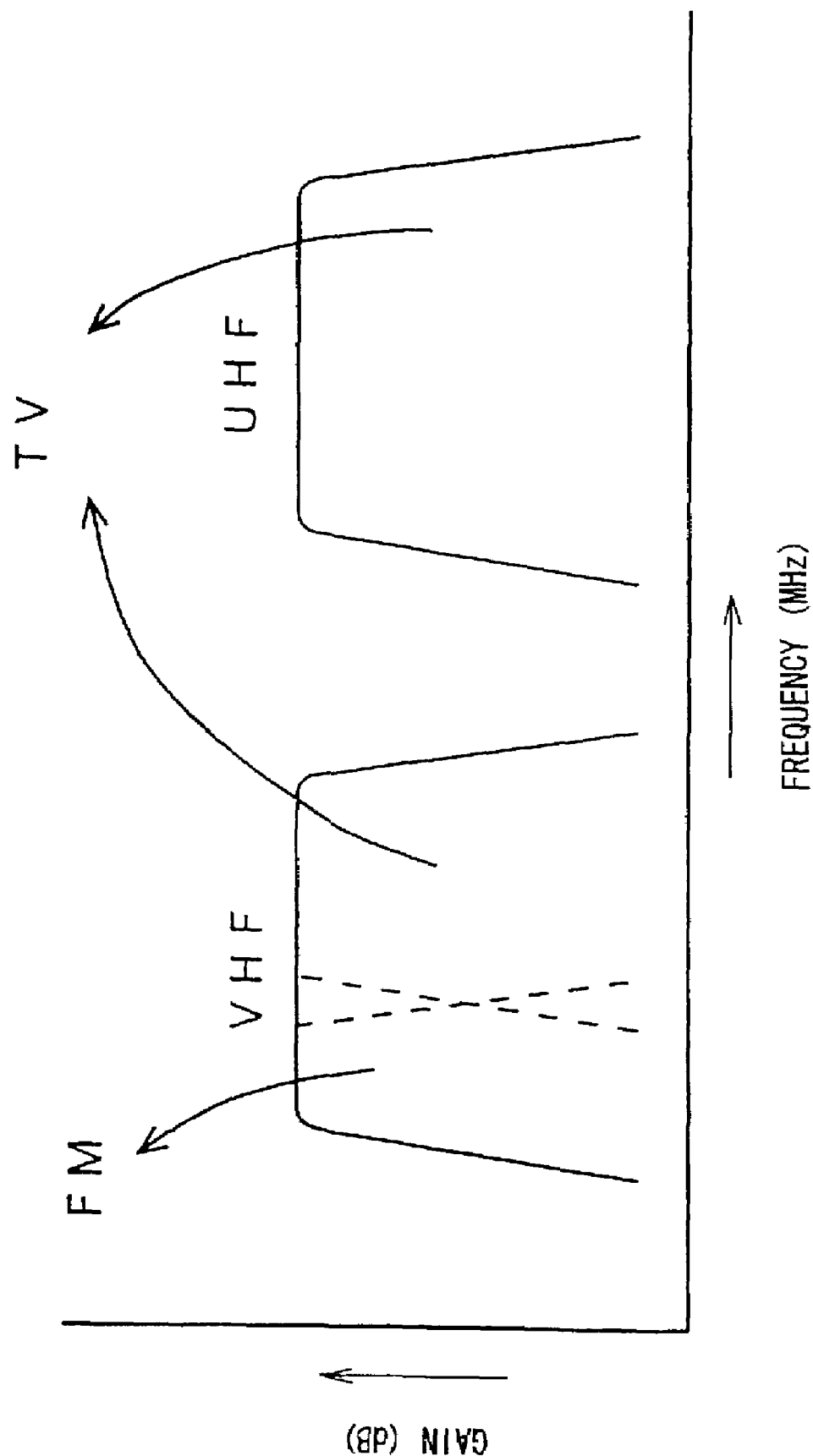
FIG. 12 is a graph showing a combination of frequency bands in the embodiment of FIG. 11.

FIG. 12 schematically shows pass band characteristics of the BPFs 93 and 94 of FIG. 11. FM signals of FM radio broadcasting and the like, and TV signals of television broadcasting and the like are included in the pass band of the VHF band in the BPF 94. TV signals of television broadcasting and the like are mainly included in the pass band of the UHF band in the BPF 93. FM signals and TV signals are contained in the high-frequency signals inputted to the AGC amplifier 92, and therefore separated from each other by a branching circuit 95 in FIG. 11. As shown in FIG. 11, TV signals which are branched as higher frequency components by the branching circuit 95 are inputted to an amplifier 97 via an FM trap circuit 96. The FM trap circuit 96 attenuates the frequency band of an FM signal, and the amplifier 97 amplifies the output level of a TV signal so as to coincide with that of a TV signal supplied from the AGC amplifier 91. The TV signal outputted from the AGC amplifier 91 and a TV signal outputted from the amplifier 97 are synthesized with each other in a synthesis circuit 98, and the synthesized signal is outputted to a television receiver in the subsequent stage.

In the shared antenna amplifier 90 of the embodiment, the AGC amplifiers 91 and 92 which are antenna amplifiers amplify high-frequency signals of different frequency bands or the UHF and VHF bands. The switchover criteria of the AGC amplifiers 91 and 92 are set to different values corresponding to the frequency bands, respectively. The switchover criterion of the AGC amplifier 91 is set for reception of television broadcasting of the UHF frequency band, and that of the AGC amplifier 92 is set for reception of FM radio broadcasting and television broadcasting of the VHF frequency band. Since the switchover criterion of the AGC amplifier 92 for the VHF frequency band is set lower, the amplifiers can be adequately selectively used so that, in the VHF frequency band, the distortion characteristic in the case of a high-level input is emphasized, and, in the UHF frequency band, the sensitivity is emphasized.

In the embodiment, a plurality of antenna amplifiers in each of which, when the level of a high-frequency signal output from an amplifier is excessive, a switching operation is performed so that the high-frequency signal is transmitted to the subsequent stage through a through-circuit without being passed through the amplifier are used for different frequency bands, respectively. The switchover criteria of the antenna amplifiers are set to different values in accordance with the frequency bands to be handled by the antenna amplifiers, respectively, thereby allowing the antenna amplifiers to adequately operate.

Figure 13:
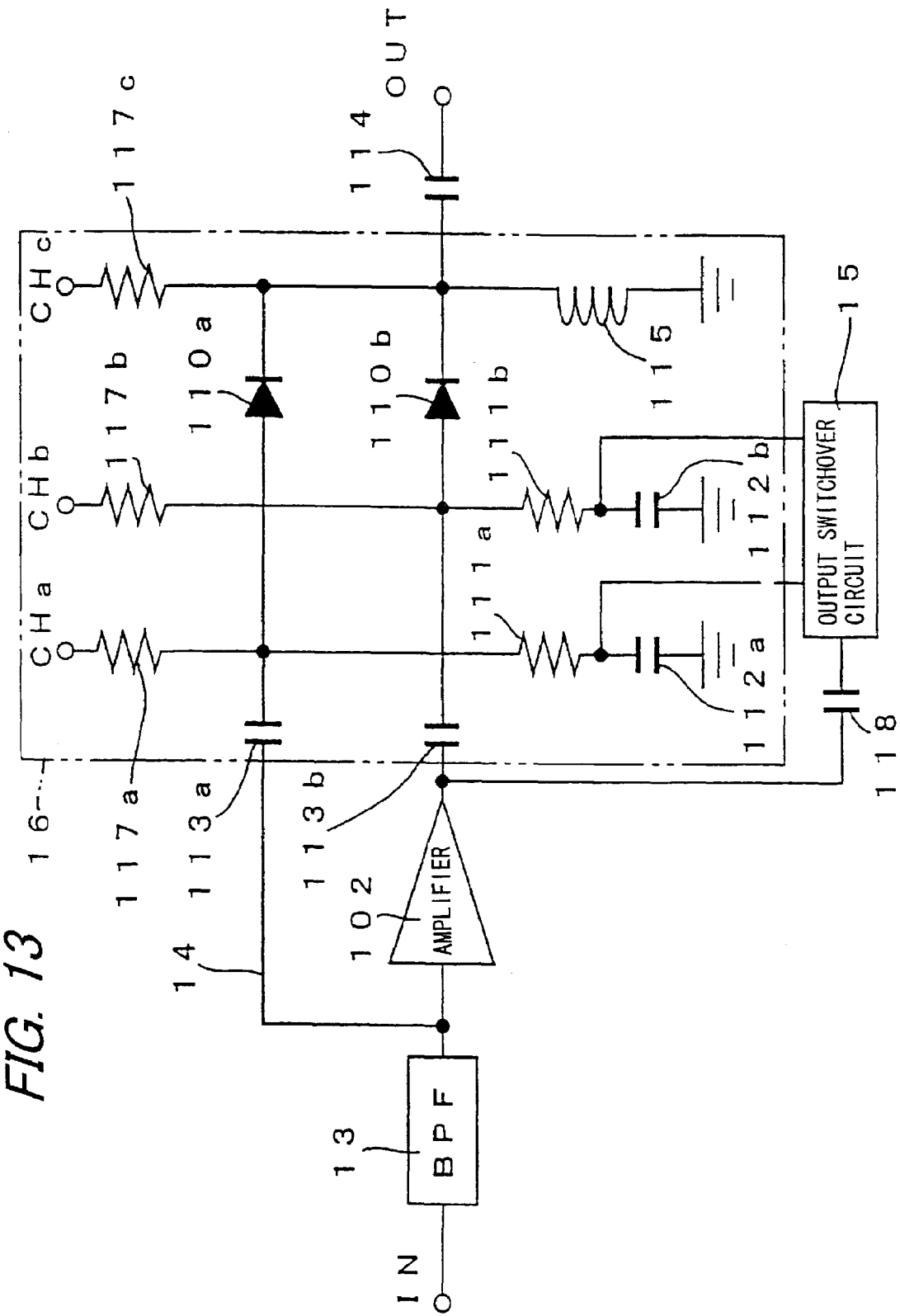
FIG. 13 is a block diagram schematically showing the configuration of an antenna amplifier which is a comparative embodiment with respect to the embodiment of FIG. 1.

FIG. 13 schematically shows the configuration of an antenna amplifier 101 which is a comparative embodiment with respect to the first embodiment of the invention. In the comparative embodiment, components corresponding to those of the embodiments which have been described above are denoted by the same reference numerals, and duplicate description is omitted. In place of an inverting amplifier, a non-inverting amplifier is used as an amplifier 102 in the comparative embodiment. The switch circuit 16 which is controlled by the output switchover circuit 15 includes PIN diodes 110a and 110b serving as electronic switching elements. The output switchover circuit 15 supplies signals for respectively switching the PIN diodes 110a and 110b, via resistors 111a and 111b. When a forward current is supplied to the PIN diode 110a or 110b, the impedance of the diode is lowered, and the diode becomes conductive to function as a switching element for a high-frequency signal. When a forward current is not supplied to the PIN diode, the impedance of the diode is raised, and the diode becomes non-conductive to function as a switching element for a high-frequency signal.

The switching output of the output switchover circuit is connected on the input side of the resistors 111a and 111b to capacitors 112a and 112b which function as bypass capacitors for guiding a high-frequency signal to the ground. Since the capacitors 112a and 112b and the like are connected, the output of the output switchover circuit 15 has a relatively large time constant. DC-blocking capacitors 113a and 113b are connected between the PIN diode 110a and the through-circuit 14, and between the PIN diode 110b and the output of the amplifier 102, respectively. The switched outputs of the PIN diodes 110a and 110b are guided to the load via a capacitor 114. A coil 115 is disposed as a return path for forward currents of the PIN diodes 110a and 110b. Resistors 117a, 117b, and 117c are connected respectively to the inputs and the common output of the PIN diodes 110a and 110b so as to form check points CHa, CHb, and CHc for waveform observation which will be described later. A DC-blocking capacitor 118 is connected between the output of the amplifier 102 and the input of the output switchover circuit 15.

For a high-frequency signal, the capacitors 113a and 113b exhibit a low impedance. In the case where a period that both the PIN diodes 110a and 110b are conductive is produced because of the above-described time constant, therefore, the output of the amplifier 102 is connected to the input of the amplifier, thereby causing the possibility that oscillation due to positive feedback occurs.

FIGS. 14, 15, 16, and 17 show transient waveforms observed respectively at: check points CHa and CHb which are connected to the individual inputs of the PIN diodes 110a and 110b via the resistors 117a and 117b in FIG. 13; a check point CHc which is connected to the common output of the diodes via the resistor 117c; and a check point CHd of an audio output from a loudspeaker of a receiver which receives and reproduces a high-frequency signal from the antenna amplifier 101.

Figure 14:
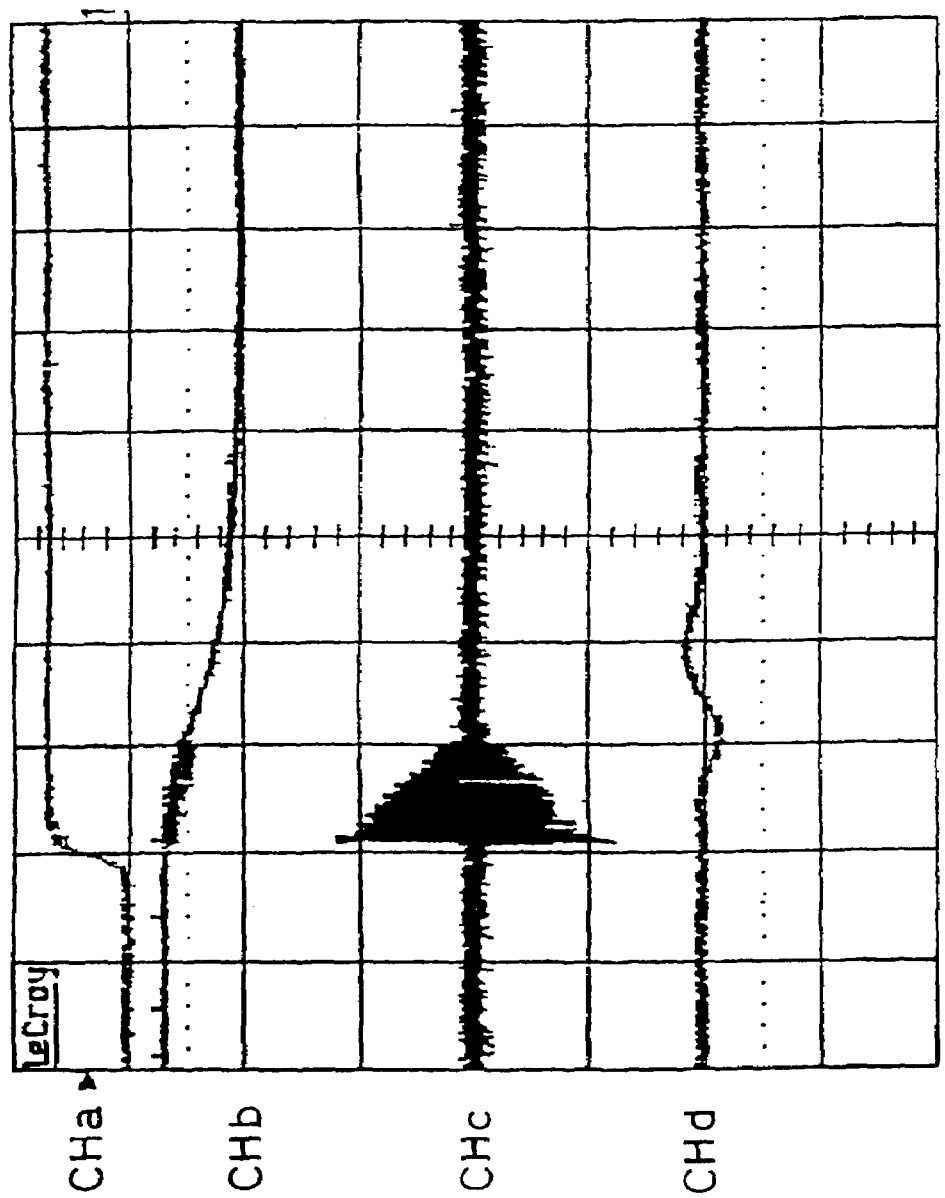
FIG. 14 is a graph showing transient characteristics during a switching operation in the antenna amplifier of FIG. 13.
Figure 15:
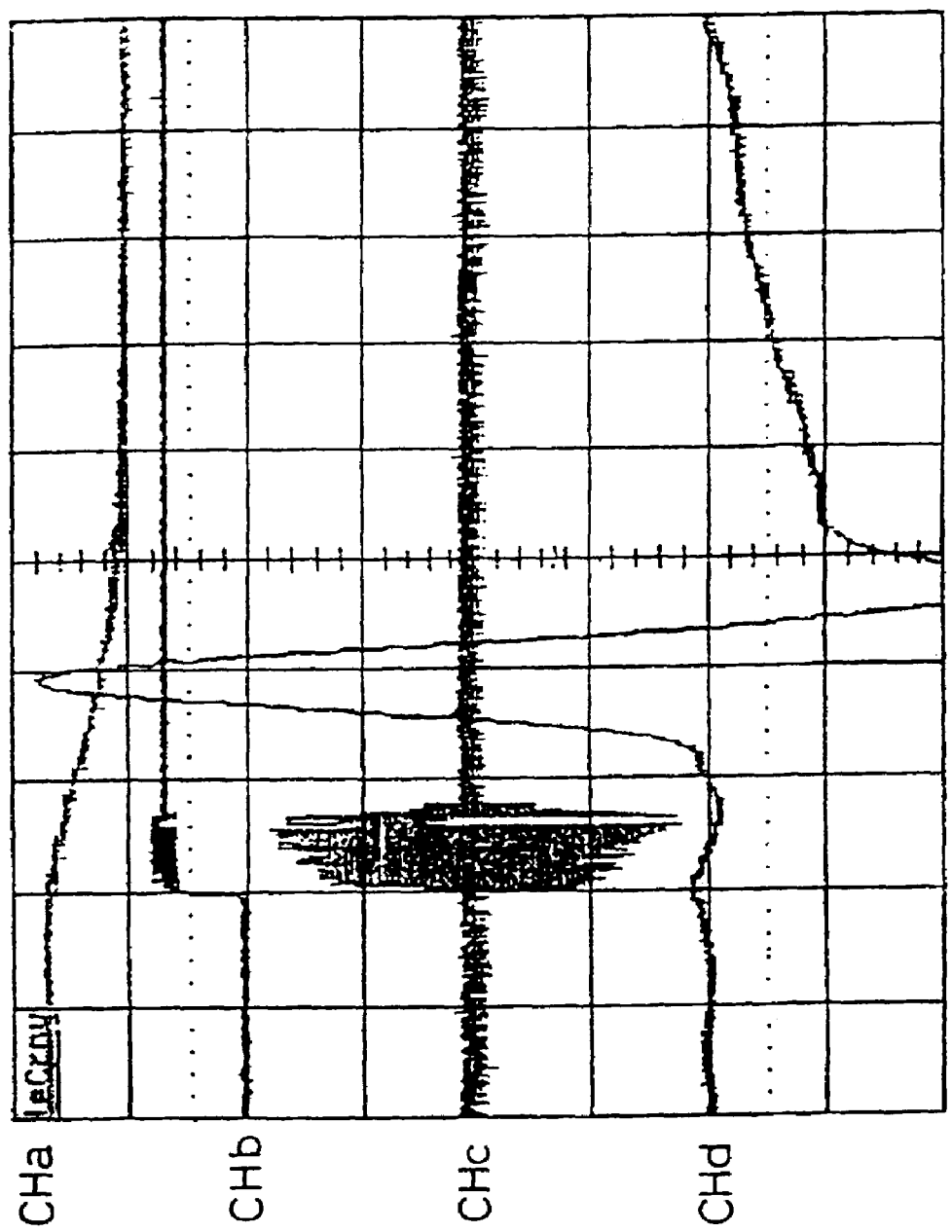
FIG. 15 is a graph showing transient characteristics during a switching operation in the antenna amplifier of FIG. 13.

FIG. 14 shows changes in the case where the PIN diode 110a is switched from OFF to ON and the PIN diode 110b is switched from ON to OFF. FIG. 15 shows changes in the case where the PIN diode 110a is switched from ON to OFF and the PIN diode 110b is switched from OFF to ON. From the waveform of the check point CHc, it is seen that the amplifier 102 oscillates at a timing of switching. At the timing of switching to the side of the amplifier shown in FIG. 15, particularly, the amplifier oscillates more easily as compared with the timing of switching to the through-circuit 14 shown in FIG. 14, and the output level of the loudspeaker at the check point CHd is high. As described above, in the case where the amplifier 102 is not an inverting amplifier, when the time constant of the output switchover circuit 15 is large, oscillation occurs.

Figure 16:
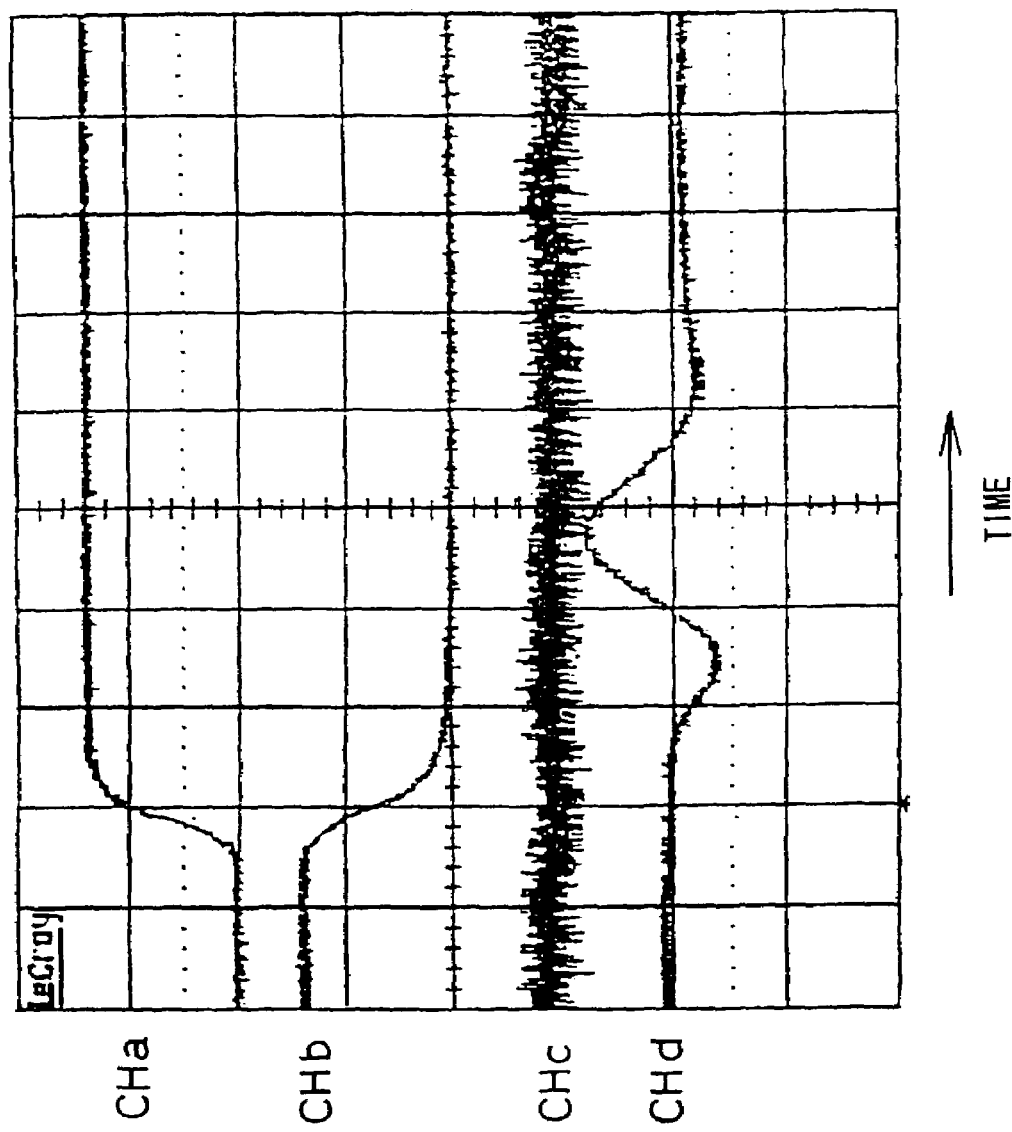
FIG. 16 is a graph showing transient characteristics during a switching operation in the antenna amplifier of FIG. 13.
Figure 17:
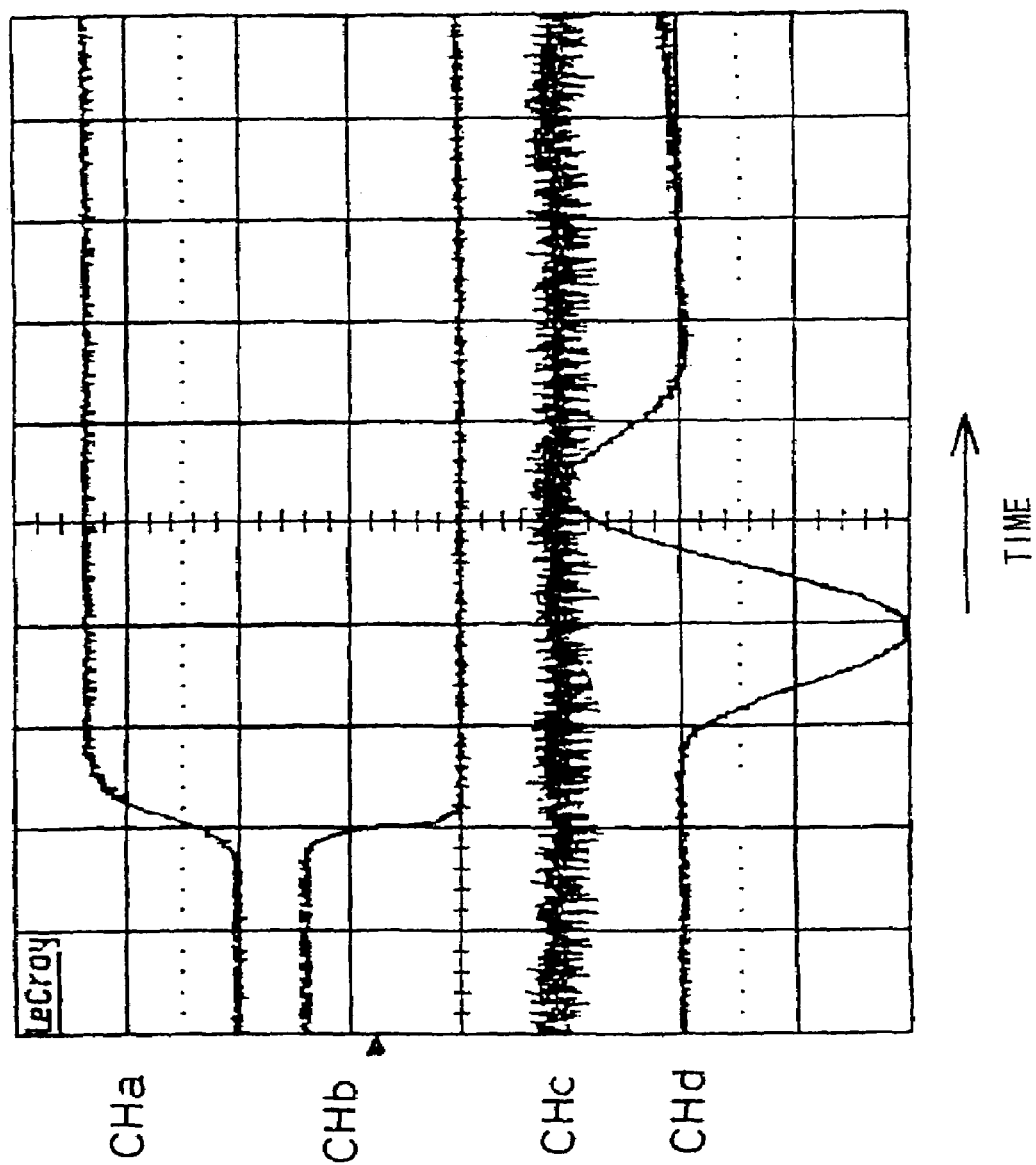
FIG. 17 is a graph showing transient characteristics during a switching operation in the antenna amplifier of FIG. 13.

FIGS. 16 and 17 comparatively show changes in the case where the PIN diode 110a is switched from OFF to ON and the PIN diode 110b is switched from ON to OFF while setting the time constant of the output switchover circuit 15 to be large, and those while setting the time constant to be small. It is seen that the noise level in the case of FIG. 17 in which the time constant is small is higher. Therefore, the time constant of the output switchover circuit 15 is preferably set to be large to some extent so that noises are reduced. When a non-inverting amplifier is used, however, oscillation occurs. In the case where an inverting amplifier similar to the amplifier 12 is used as the amplifier 52 in the other embodiment, oscillation hardly occurs and noises can be reduced even when the time constant of the output switchover circuit 15 is set to be relatively large and the switching operation is performed by a smoothing process.

Figure 18:
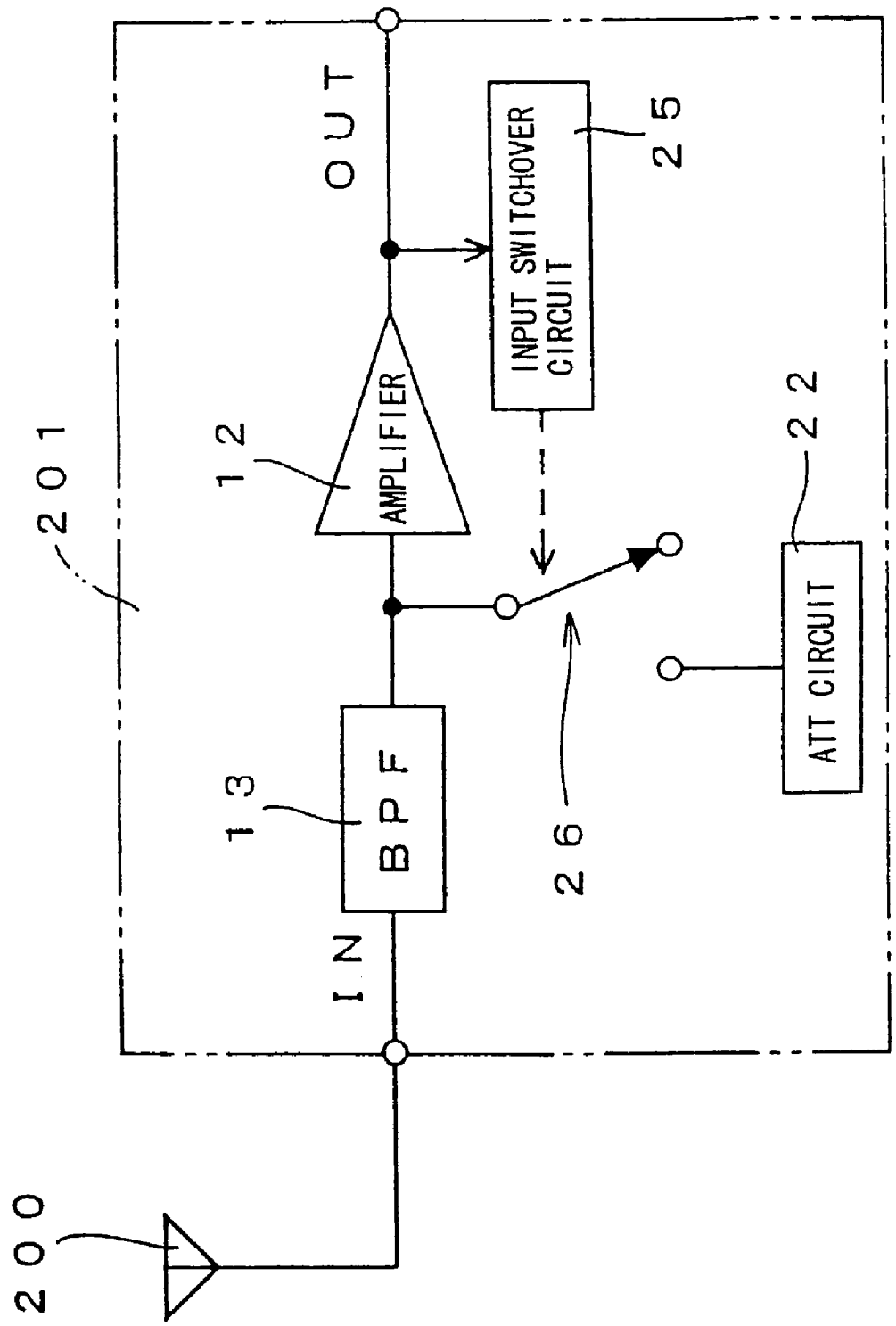
FIG. 18 is a block diagram schematically showing the configuration of an antenna amplifier which is a sixth embodiment of the invention.

FIG. 18 schematically shows the configuration of an antenna amplifier 201 which is a sixth embodiment of the invention, and which is disposed for an AM antenna 200. In the embodiment, components corresponding to those of the embodiments which have been described above are denoted by the same reference numerals, and duplicate description is omitted. In the embodiment, in order to configure an AM antenna amplifier, the attenuator (ATT) circuit 22 is disposed in the input side in place of the through-circuit 14 of FIG. 1, and the input switchover circuit 25 and the switch circuit 26 perform the switching operation so that, in the case of a high-input level, switching to the through-circuit is not conducted and an input from the antenna 200 is attenuated by the attenuator circuit 22.

Figure 19:
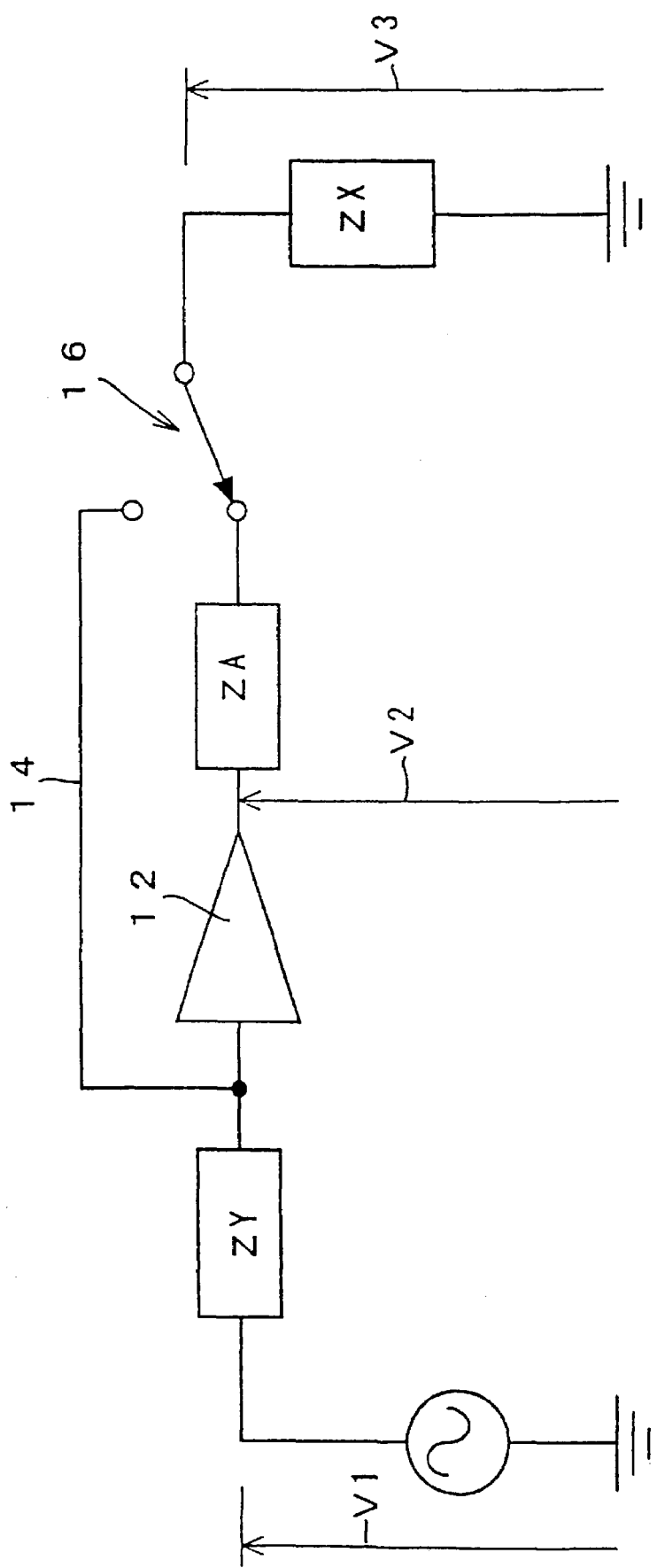
FIG. 19 is an equivalent circuit diagram of a configuration in which the antenna amplifier of FIG. 1 is used as an AM antenna amplifier.
Figure 20:
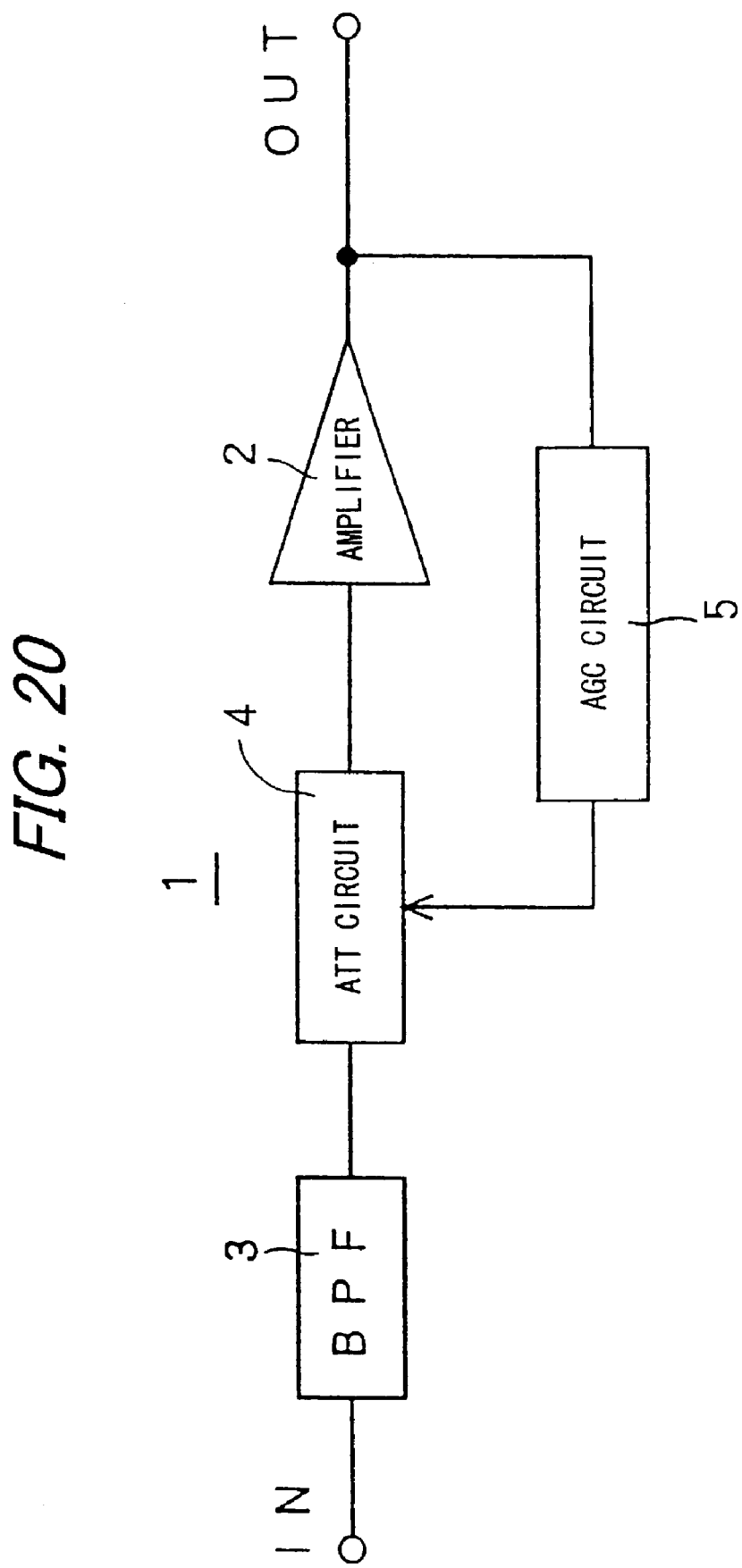
FIG. 20 is a block diagram schematically showing the configuration of an antenna amplifier of a related art technique.

FIG. 19 shows an equivalent circuit of a configuration in which the antenna amplifier 11 of FIG. 1 is used as the AM antenna amplifier. In AM broadcasting, the medium frequency band in which a radio wave has a long wavelength is used, and hence the impedance ZY of the antenna 200 is large. When the voltage of the reception output from the AM antenna 200 is indicated by V1, the output voltage of the amplifier 12 is indicated by V2, and the input voltage to the load is indicated by V3, the following relationship is held when the antenna amplifier 11 is used:

$$\frac{V2}{ZA+ZX} = \frac{V3}{ZX}$$

$$V3 = \frac{ZX}{ZA+ZX} \times V2$$

When $ZA \ll ZX$, therefore, $V3 \approx V2$ is attained. By contrast, in the through state where the switch circuit 16 is switched to the side of the through-circuit 14, the following relationship is held:

$$\frac{V1}{ZY+ZX} = \frac{V3}{ZX}$$

$$V3 = \frac{ZX}{ZY+ZX} \times V1$$

When $ZY \gg ZX$, therefore, $V3 \approx 0$ is attained. As a result, in a relatively low frequency band such as the medium frequency band in which AM broadcasting is received, when the circuit is set to the through state, the input voltage V3 to the load is substantially 0, and hence it is almost impossible to receive broadcasting.

In the embodiment, when an AM antenna amplifier in which the impedance ZY of the antenna 200 is large is to be configured, in the case of a high-input level, switching to the signal through state in which a signal is passed through the through-circuit is not conducted, and the input to the amplifier 12 is attenuated and then amplifier by the amplifier 12. Even when the impedance in reception of a signal from the antenna amplifier 201 is low, therefore, the signal can be prevented from being excessively attenuated.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An antenna amplifier which is to be disposed in a vicinity of an antenna, for amplifying a weak high-frequency signal received by the antenna, the antenna amplifier comprising:
    a filter operable to receive a high-frequency signal from the antenna, operable to select a frequency band of the received high-frequency signal, and operable to output a high frequency signal of the selected frequency band;
    an amplifier connected to the filter, the amplifier being operable to amplify the high-frequency signal outputted from the filter;
    a through-circuit connected with the filter, the through-circuit being operable to guide the high-frequency signal outputted from the filter, without passing through the amplifier;
    a switch circuit connected to an output of the amplifier and an output of the through-circuit, the switch circuit being operable to switch between a high-frequency signal outputted from the amplifier and the high-frequency signal guided through the through-circuit; and
    an output switchover circuit, which in response to an output of the amplifier and in accordance with a level relationship of the output with respect to a predetermined switchover criterion, is operable to control the switch circuit to be switched to a side of the output of the amplifier when the output is lower, and to be switched to a side of the through-circuit when the output is higher,
    wherein a level detection for switching is performed between the amplifier and the switch circuit,
    wherein the amplifier has a negative feedback configuration, and
    wherein, in a case of an input of a high level, an output of the amplifier is opened, whereby distortion of the amplifier itself is reduced and distortion which is generated in an input portion is eliminated.

2. The antenna amplifier of claim 1, wherein the output switchover circuit has hysteresis, thereby preventing the switch circuit from performing frequent switching operations due to electric field variations.

3. The antenna amplifier of claim 1,
    wherein the output switchover circuit is subjected to a smoothing process, thereby preventing noises from being generated during switching operation, and
    wherein the amplifier is configured as an inverting amplifier, thereby preventing oscillation from occurring at a timing when the switch circuit is connected to both the output side of the amplifier and the through-circuit during the switching operation.

4. The antenna amplifier of claim 1,
    wherein, when the antenna amplifier constitutes an AM antenna amplifier, an attenuator circuit is disposed in an input side in place of the through-circuit, and the antenna amplifier includes a switch circuit and an input switchover circuit in place of the switch circuit and the output switchover circuit, and the switch circuit and the input switchover circuit cooperate to with each other and, in a case of an input of a high level, perfonn a switching operation to cause the input to be attenuated by the attenuator circuit instead of the operation of switching to the through-circuit.

5. A shared antenna amplifier comprising:
    a plurality of antenna amplifiers of claim 1,
    wherein the plurality of antenna amplifiers amplify high-frequency signals of different frequency bands, respectively, and
    wherein switchover criteria of the plurality of antenna amplifiers are set to different values corresponding to frequency bands, respectively.

6. The shared antenna amplifier of claim 5,
    wherein the plurality of antenna amplifiers are an antenna amplifier for receiving FM radio broadcasting and television broadcasting of a VHF frequency band, and an antenna amplifier for receiving television broadcasting of a UHF frequency band, and
    wherein the switchover criterion of the antenna amplifier for the VHF frequency band is set to be lower than the switchover criterion of the antenna amplifier for the UHF frequency band.

7. The antenna amplifier of claim 1, wherein the output of the amplifier is input directly to the output switchover circuit.

8. The antenna amplifier of claim 1, wherein the high-frequency signal outputted from the filter is received at the amplifier regardless of a position of the switch circuit.

* * * * *